(12) United States Patent
Shiota et al.

(10) Patent No.: US 7,714,387 B2
(45) Date of Patent: May 11, 2010

(54) SEMICONDUCTOR DEVICE WITH THIN-FILM TRANSISTORS AND METHOD OF FABRICATING THE SAME

(75) Inventors: Kunihiro Shiota, Kanagawa (JP); Hiroshi Okumura, Kanagawa (JP)

(73) Assignee: NEC LCD Technologies, Ltd., Kawasaki (JP)

( * ) Notice: Subject to any disclaimer, the term of this patent is extended or adjusted under 35 U.S.C. 154(b) by 439 days.

(21) Appl. No.: 11/481,042

(22) Filed: Jul. 6, 2006

(65) Prior Publication Data
US 2007/0029614 A1 Feb. 8, 2007

(30) Foreign Application Priority Data
Aug. 5, 2005 (JP) .............................. 2005-228586

(51) Int. Cl.
*H01L 29/00* (2006.01)
*H01L 23/544* (2006.01)

(52) U.S. Cl. .......................... 257/352; 257/59; 257/72; 257/347; 257/353; 257/797; 257/E27.111; 257/E27.112; 257/E29.147; 257/E29.273; 257/E29.299; 438/149

(58) Field of Classification Search .................. 257/72, 257/E51.005, 347, 352, 353, 797, E27.111, 257/E27.112, E29.147, E29.273, E29.299; 438/149
See application file for complete search history.

(56) References Cited

U.S. PATENT DOCUMENTS

| 5,563,427 | A | * | 10/1996 | Yudasaka et al. | ............... 257/72 |
| 5,581,102 | A | * | 12/1996 | Kusumoto | .................. 257/347 |
| 5,821,562 | A | * | 10/1998 | Makita et al. | .................. 257/64 |
| 2003/0215987 | A1 | * | 11/2003 | Shiota et al. | ................. 438/151 |
| 2006/0027809 | A1 | * | 2/2006 | Ogawa et al. | .................. 257/66 |

FOREIGN PATENT DOCUMENTS

| JP | 3211340 | 7/2001 |
| JP | 2003-332349 | 11/2003 |

* cited by examiner

*Primary Examiner*—Matthew E Warren
*Assistant Examiner*—John Lin
(74) *Attorney, Agent, or Firm*—McGinn IP Law Group, PLLC

(57) ABSTRACT

A semiconductor device with a TFT includes a substrate, an island-shaped semiconductor film serving as an active layer of the TFT on or over the substrate, a pair of source/drain regions formed in the semiconductor film, and a channel region formed between the pair of source/drain regions in the semiconductor film. The pair of source/drain regions is thinner than the remainder of the semiconductor film other than the source/drain regions. The thickness difference between the pair of source/drain regions and the remainder of the semiconductor film is in a range from 10 angstrom (Å) to 100 angstrom. The total process steps are reduced and the operation characteristic and reliability of the device are improved.

14 Claims, 22 Drawing Sheets

FIRST EMBODIMENT

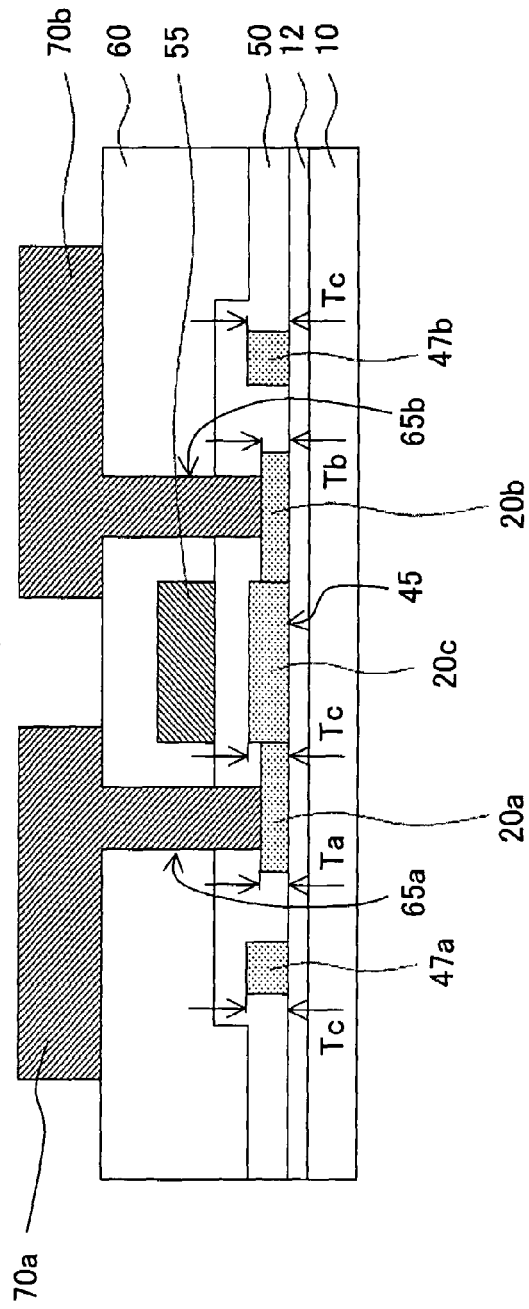
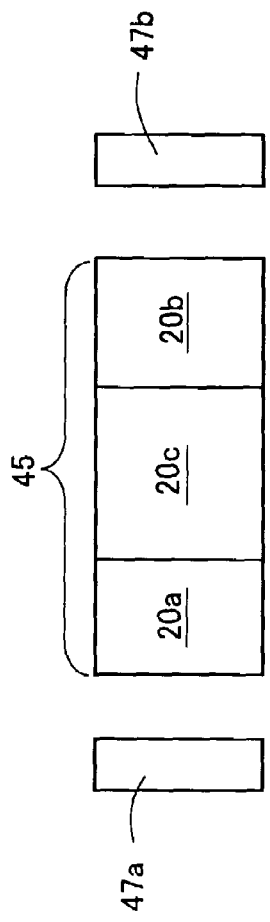
FIG. 1A
FIRST EMBODIMENT
FIG. 1B

FIRST EMBODIMENT
(1) FORMING BACKING FILM ON GLASS PLATE (2) FORMING AMORPHOUS SILICON FILM (3) FORMING MASK FOR FIRST ALIGNMENT MARKS AND S/D REGIONS (4) IMPLANTING IMPURITY INTO AMORPHOUS SILICON FILM (5) ETCHING AMORPHOUS SILICON FILM (6) FORMING POLYSILICON FILM BY ELA (7) FORMING MASK FOR SECOND ALIGNMENT MARKS AND POLYSILICON ISLAND (8) ETCHING POLYSILICON FILM (9) FORMING GATE INSULATING FILM

(10) FORMING GATE ELECTRODE/LINE

(11) FORMING INTERLAYER INSULATING FILM

(12) FORMING CONTACT HOLES

F I G. 2M
(13) FORMING S/D LINES
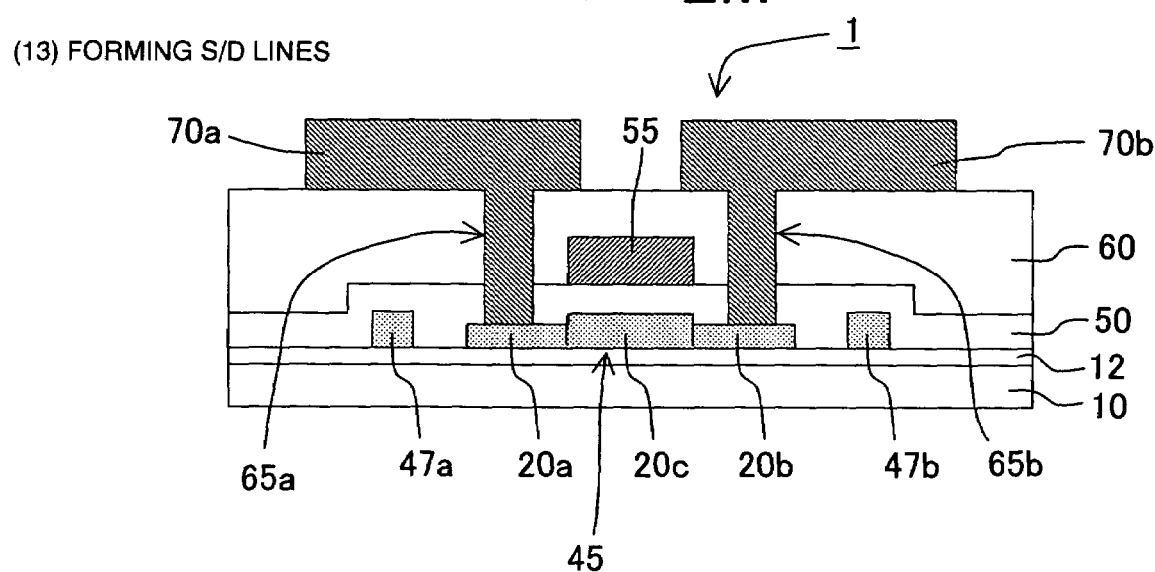

SECOND EMBODIMENT
(6) IMPLANTING IMPURITY INTO AMORPHOUS SILICON FILM (7) FORMING POLYSILICON FILM AND ACTIVATING IMPURITY BY ELA (8) FORMING MASK FOR SECOND ALIGNMENT MARKS AND POLYSILICON ISLAND (9) ETCHING POLYSILICON FILM

(10) FORMING GATE INSULATING FILM

(11) FORMING GATE ELECTRODE/LINE

(12) FORMING INTERLAYER INSULATING FILM

(13) FORMING CONTACT HOLES

(14) FORMING S/D LINES

THIRD EMBODIMENT (3) FORMING MASK FOR SECOND ALIGNMENT MARKS AND N-TYPE S/D REGIONS (4) IMPLANTING N-TYPE IMPURITY INTO AMORPHOUS SILICON FILM (5) ETCHING N-TYPE IMPURITY-DOPED REGIONS (6) FORMING MASK FOR P-TYPE S/D REGIONS (7) IMPLANTING P-TYPE IMPURITY INTO AMORPHOUS SILICON FILM (8) FORMING POLYSILICON FILM AND ACTIVATING N- AND P-TYPE IMPURITIES BY ELA (9) FORMING MASK FOR SECOND ALIGNMENT MARKS AND POLYSILICON ISLANDS

(10) FORMING MASK FOR SECOND ALIGNMENT MARKS AND POLYSILICON ISLANDS

(11) FORMING GATE INSULATING FILM

(12) FORMING GATE ELECTRODE/LINE

(13) FORMING INTERLAYER INSULATING FILM

(14) FORMING CONTACT HOLES

(15) FORMING S/D LINES

F I G. 5A
FOURTH EMBODIMENT
(8) FORMING MASK FOR CHANNEL REGION OF N-CHANNEL TFT
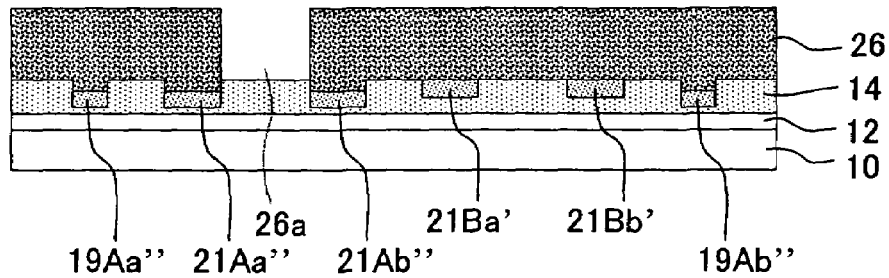
F I G. 5B
(9) IMPLANTING P-TYPE IMPURITY INTO AMORPHOUS SILICON FILM
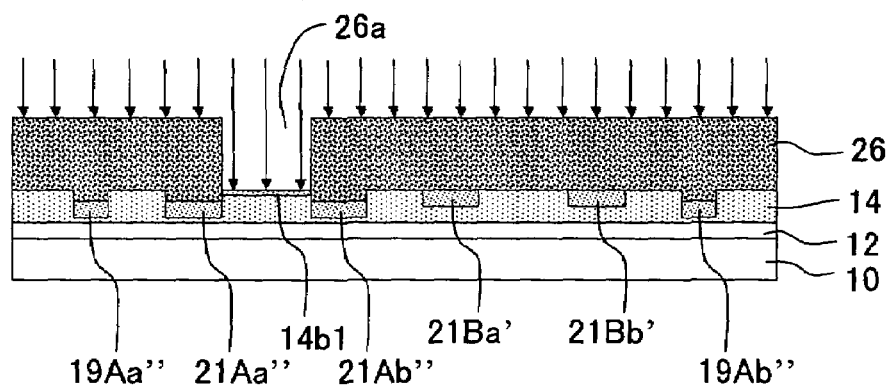
F I G. 5C
(10) FORMING MASK FOR CHANNEL REGION OF P-CHANNEL TFT
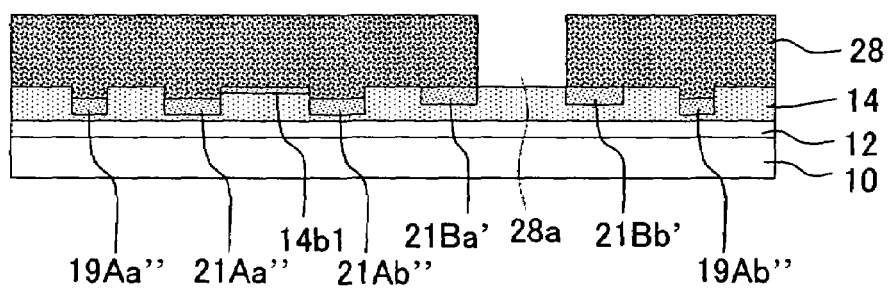

(11) IMPLANTING N-TYPE IMPURITY INTO AMORPHOUS SILICON FILM

(12) FORMING POLYSILICON FILM AND ACTIVATING P- AND N-TYPE IMPURITIES BY ELA

(13) FORMING MASK FOR SECOND ALIGNMENT MARKS AND POLYSILICON ISLANDS

(14) ETCHING POLYSILICON FILM

(15) FORMING GATE INSULATING FILM

(16) FORMING GATE ELECTRODES/LINES

(17) FORMING INTERLAYER INSULATING FILM

(18) FORMING CONTACT HOLES

(19) FORMING S/D LINES

FIFTH EMBODIMENT (8) IMPLANTING IMPURITY FOR THRESHOLD CONTROL (9) FORMING POLYSILICON FILM AND ACTIVATING N- AND P-TYPE IMPURITIES BY ELA

(10) FORMING MASK FOR SECOND ALIGNMENT MARKS AND POLYSILICON ISLANDS

(11) FORMING SECOND ALIGNMENT MARKS AND POLYSILICON ISLANDS

(12) FORMING GATE INSULATING FILM

(13) FORMING GATE ELECTRODES/LINES

(14) FORMING INTERLAYER INSULATING FILM

(15) FORMING CONTACT HOLES

(16) FORMING S/D LINES

SIXTH EMBODIMENT
(6) FORMING MASK FOR LDD REGIONS (7) IMPLANTING IMPURITY INTO AMORPHOUS SILICON FILM (8) FORMING POLYSILICON FILM BY ELA (9) FORMING MASK FOR SECOND ALIGNMENT MARKS AND POLYSILICON ISLAND

(10) FORMING SECOND ALIGNMENT MARKS AND POLYSILICON ISLAND

(11) FORMING GATE INSULATING FILM

(12) FORMING GATE ELECTRODE/LINE

(13) FORMING INTERLAYER INSULATING FILM

(14) FORMING CONTACT HOLES

(15) FORMING S/D LINES

SEMICONDUCTOR DEVICE WITH THIN-FILM TRANSISTORS AND METHOD OF FABRICATING THE SAME

BACKGROUND OF THE INVENTION

1. Field of the Invention

The present invention relates to a semiconductor device with Thin-Film Transistors (TFTs) and a method of fabricating the device. The semiconductor device according to the invention is applicable to circuit elements of Liquid-Crystal Display (LCD) devices, such as switching elements for the pixels, elements for the driver circuit, and so on. Here, it is preferred for the TFTs that the active layer is formed by a polycrystalline silicon (i.e., polysilicon) thin film.

2. Description of the Related Art

Generally, the LCD device comprises a substrate on which TFTs are arranged in a matrix array (which is termed the "TFT substrate" below), another substrate opposed to the TFT substrate at a predetermined gap (which is termed the "opposite substrate" below), and a liquid crystal layer located between the TFT substrate and the opposite substrate. With the fabrication processes of the TFT substrate, to ensure the fabrication yield and the TFT characteristics stability, it is important to correctly control the alignment between the patterns in each of the processes.

A conventional, popular method of fabricating the TFT substrate is as follows:

Specifically, first, an insulating backing film made of silicon dioxide ($SiO_2$), silicon nitride (SiN), silicon oxynitride (SiON), or the like is formed on a glass plate and then, an amorphous silicon film is formed on the backing film by Chemical Vapor Deposition (CVD) or the like. "Amorphous silicon" may be simplified as "a-Si" below. Thereafter, a first photosensitive resist film is formed on the a-Si film, and the a-Si film thus formed is subjected to a selective exposure process and a development process, thereby forming a first mask with a pattern for first alignment marks. Using the first mask thus formed, the a-Si film is selectively etched to form first alignment marks. After that, the first mask is removed.

Next, the a-Si film (wherein the first alignment marks have been formed) is crystallized by the solid-phase growth, the excimer laser annealing, or the like, resulting in a polycrystalline silicon film (which may be simply termed a polysilicon film below). Then, a second photosensitive resist film is formed on the polysilicon film and is subjected to a selective exposure process and a development process, resulting in a second mask with a pattern for semiconductor islands and second alignment marks. In the selective exposure process of the second photosensitive resist film, alignment is carried out using the above-described first alignment marks.

Next, using the second mask thus formed, the polysilicon film is selectively etched. Thus, the polysilicon film is patterned to form semiconductor islands (i.e., polysilicon islands). At the same time, second alignment marks are formed by the same polysilicon film. Thereafter, the second mask is removed.

Subsequently, a third photosensitive resist film is formed and is subjected to selective exposure and development processes, thereby forming a third mask with a pattern for impurity implantation. Then, using the third mask thus formed, impurity or dopant ions are selectively implanted into source/drain formation regions (which are regions to be formed as source/drain regions later and which may be termed S/D formation regions below) of the island-shaped polysilicon film (i.e., the polysilicon islands). Thus, pairs of source/drain regions (which may be termed S/D regions below) are formed in the respective polysilicon islands. After the third mask is removed, the implanted impurity ions into the polysilicon islands are activated by an excimer laser annealing process, a thermal annealing process, or the like.

Thereafter, subsequent process steps for gate insulating film formation, gate electrode/line formation, interlayer insulating film formation, contact hole formation, and source/drain line formation are carried out successively, resulting in the TFT substrate.

As explained above, with the conventional fabrication method of a TFT substrate, to form the first alignment marks only, it is necessary to conduct five process steps of formation, exposure and development of the first photosensitive resist mask, etching of the a-Si film, and removal of the first photosensitive resist mask. Therefore, there is a problem that the total number of the necessary process steps increases and the fabrication cost becomes high. So, to reduce the total number of the process steps, various measures have been developed and disclosed, an example of which is disclosed in the Japanese Non-Examined Patent Publication No. 2003-332349 published on Nov. 21, 2003. The measure disclosed in the Publication No. 2003-332349 is as follows.

Specifically, in the step of forming the a-Si film on the insulating backing film formed on the glass plate, a region where the a-Si film is not placed (i.e., an a-Si film nonexistence region) is formed on the periphery of the glass plate and at the same time, a region where the a-Si film is placed (i.e., an a-Si film formation region) is formed on the inside of the a-Si film nonexistence region on the glass plate. The a-Si film nonexistence region is formed by concealing or covering the periphery of the glass plate in the step of forming the a-Si film. Then, a photosensitive resist film is formed on both the a-Si film nonexistence region and the a-Si film formation region and then, the photosensitive resist film thus formed is selectively exposed and developed, thereby forming a mask having a pattern for impurity implantation and a pattern for alignment mark formation. The pattern for impurity implantation is placed on the a-Si film formation region, and the pattern for alignment mark formation is placed on the a-Si film nonexistence region.

Subsequently, a predetermined impurity is selectively implanted into the a-Si film using the above-described mask, and then, the insulating backing film is selectively etched using the same mask. As a result, S/D formation regions are formed in the a-Si film formation region of the a-Si film and at the same time, alignment marks are formed by the insulating backing film in the a-Si film nonexistence region. After this etching process is completed, the mask is removed.

With the method disclosed in the Publication No. 2003-332349, the above-described five process steps for forming the first alignment marks in the above-described conventional method of fabricating a TFT substrate are omitted in the above-described way. Thus, the fabrication cost increase is suppressed.

Moreover, to omit the activation process for the implanted impurity into the a-Si film to thereby shorten the fabrication process sequence, the following method was developed. This method is disclosed in the Japanese patent No. 3211340 published on Jul. 19, 2001.

Specifically, an a-Si film is deposited on an insulating plate and then, a predetermined impurity or dopant is selectively implanted into S/D formation regions of the a-Si film, thereby forming impurity-doped regions in the a-Si film. Thereafter, an excimer laser beam is directly irradiated to the impurity-doped regions, thereby turning the a-Si film into a polysilicon film (i.e., crystallization of the a-Si film) and activating the impurity existing in the impurity-doped regions simultaneously. This method is termed the excimer laser annealing method. With this method, both the crystallization of the a-Si film and the activation of the doped impurity can be carried out simultaneously and therefore, the fabrication process sequence is shortened. Consequently, fabrication cost increase is prevented.

As clearly seen from the method disclosed in the Publication No. 2003-332349, to shorten the fabrication process sequence (i.e., to reduce the total number of the necessary process steps), it is effective to form the pattern for impurity implantation and the pattern for alignment mark formation through a single set of exposure and development processes, or to simultaneously conducting the crystallization of the a-Si film and the activation of the impurity implanted into the a-Si film. However, if the pattern for impurity implantation and the pattern for alignment mark formation are formed through a single set of exposure and development processes using the method disclosed in the Publication No. 2003-332349, the alignment marks are located only on the periphery of the glass plate. Thus, a disadvantage that alignment accuracy deteriorates in the middle area of the glass plate arises.

In addition, the region for forming the alignment marks needs to be provided on the periphery of the glass plate and thus, the region for forming TFTs is narrowed. As a result, another disadvantage that the fabrication cost increases arises.

Moreover, if, similar to the method disclosed in the Japanese patent No. 3211340, a desired impurity is selectively implanted into the S/D formation regions of the a-Si film and thereafter, the crystallization of the a-Si film and the activation of the impurity ions are carried out simultaneously by excimer laser irradiation, heavy-metal impurity (which is unavoidably implanted into the surface of the a-Si film along with the desired impurity) is likely to diffuse toward the inside of the a-Si film during the excimer laser irradiation. If so, a disadvantage that the heavy-metal impurity thus diffused degrade the characteristics and reliability of the TFTs to be formed using the said a-Si film will occur.

SUMMARY OF THE INVENTION

The present invention was created in consideration of the above-described disadvantages.

An object of the present invention is to provide a semiconductor device with a TFT or TFTs that reduces the total number of necessary process steps and that improves the operation characteristics and reliability, and a method of fabricating the device.

Another object of the present invention is to provide a semiconductor device with a TFT or TFTs that ensures higher alignment accuracy than the conventional semiconductor devices of this type, and a method of fabricating the device.

Still another object of the present invention is to provide a semiconductor device with a TFT or TFTs that reduces the fabrication cost than the conventional semiconductor devices of this type, and a method of fabricating the device.

The above objects together with others not specifically mentioned will become clear to those skilled in the art from the following description.

According to a first aspect of the present invention, a semiconductor device with a TFT is provided, which comprises a substrate;

an island-shaped semiconductor film formed directly on the substrate or over the substrate with an intervening backing film, the semiconductor film serving as an active layer of a TFT;

a pair of source/drain regions (S/D regions) of the TFT, formed in the semiconductor film; and a channel region of the TFT, formed between the pair of source/drain regions in the semiconductor film;

wherein the pair of source/drain regions are smaller in thickness than a remainder of the semiconductor film;

and wherein a thickness difference between the pair of source/drain regions and the remainder of the semiconductor film is set in a range from 10 angstrom (Å) to 100 angstrom.

Here, the reason why the thickness difference between the pair of source/drain regions and the remainder of the semiconductor film is set in a range from 10 angstrom to 100 angstrom is as follows:

The minimum value of 10 angstrom was determined by the fact that the minimum readable depth (i.e., the minimum thickness difference) of alignment marks with an exposure apparatus is 10 angstrom.

The maximum value of 100 angstrom was determined by the following reason. When the semiconductor film is formed by crystallization of an amorphous semiconductor film by the excimer laser annealing, the maximum possible depth (i.e., the maximum thickness difference) of alignment marks under the condition that the shape of the alignment marks can be kept at a level where the said alignment marks are readable with an exposure apparatus is 100 angstrom.

With the semiconductor device according to the first aspect of the present invention, the thickness of the pair of source/drain regions is smaller than the thickness of the remainder of the semiconductor film by a value within the range from 10 angstrom to 100 angstrom. This means that the surfaces of the pair of source/drain regions (i.e., the semiconductor film) are selectively removed or eliminated. Thus, when a desired impurity is implanted into the parts of the semiconductor film to be the source/drain regions later (i.e., the source/drain formation regions), heavy metal impurity implanted into the semiconductor film along with the desired impurity is removed by selective removal of the surfaces of the pair of source/drain regions.

Accordingly, when the crystallization of the amorphous semiconductor film and the activation of the implanted impurity are carried out simultaneously by the excimer laser annealing, heavy-metal impurity implanted into the amorphous semiconductor film along with the desired impurity will not diffuse toward the inside of the amorphous semiconductor film (i.e., the source/drain regions). As a result, the operation characteristics and reliability of the TFT (i.e., the semiconductor device including the said TFT) can be improved.

Moreover, by forming the pattern for impurity implantation and the pattern for alignment mark formation through a single set of exposure and development processes and by simultaneously conducting the crystallization of the semiconductor film and the activation of the impurity implanted into the semiconductor film, the total number of the necessary process steps can be reduced. As a result, the fabrication cost can be lowered furthermore.

It is preferred that the semiconductor film is polycrystalline. More preferably, the polycrystalline semiconductor film is formed by crystallizing an amorphous semiconductor film.

In a preferred embodiment of the semiconductor device according to the first aspect of the present invention, alignment marks are additionally provided outside and near the semiconductor film. The alignment marks are made of a same material as the semiconductor film. In this embodiment, unlike the structure as disclosed in the above-described Publication No. 2003-332349 that the alignment marks are disposed on the periphery of the substrate, the alignment marks are disposed outside and near the semiconductor film. Therefore, the alignment marks may be used for alignment or positioning of an upper (i.e., a higher level) pattern with respect to the semiconductor film. Consequently, there is an additional advantage that higher alignment accuracy than ever is obtainable.

In another preferred embodiment of the semiconductor device according to the first aspect of the present invention, the alignment marks are equal in thickness to the remainder of the semiconductor film. In this embodiment, there is an additional advantage that still higher alignment accuracy is obtainable.

In still another preferred embodiment of the semiconductor device according to the first aspect of the present invention, an additional island-shaped semiconductor film is formed directly on the substrate or over the substrate with the intervening backing film, the additional semiconductor film serving as an active layer of an additional TFT. An additional pair of source/drain regions (S/D regions) of the additional TFT is formed in the additional semiconductor film. An additional channel region of the additional TFT is formed between the additional pair of source/drain regions in the additional semiconductor film. The additional pair of source/drain regions is equal in thickness to a remainder of the additional semiconductor film. In this embodiment, there is an additional advantage that a complementary TFT structure is obtainable.

According to a second aspect of the present invention, a method of fabricating a semiconductor device with a TFT is provided. This method comprises the steps of:

forming an amorphous semiconductor film directly on a substrate or over a substrate with an intervening backing film;

forming a first mask on the amorphous semiconductor film, the first mask having a first pattern for source/drain regions and a second pattern for first alignment marks;

selectively implanting an impurity into the amorphous semiconductor film using the first mask, thereby forming first impurity-doped regions by the first pattern and second impurity-doped regions by the second pattern;

selectively etching surfaces of the first impurity-doped regions and surfaces of the second impurity-doped regions using the first mask;

irradiating laser light to the amorphous semiconductor film including the surface-etched first impurity-doped regions and the surface-etched second impurity-doped regions, thereby crystallizing the amorphous semiconductor film to form a polycrystalline semiconductor film and activating the impurity implanted into the first impurity-doped regions and the second impurity-doped regions;

forming a second mask on the polycrystalline semiconductor film, the second mask having a third pattern for a semiconductor island; and selectively etching the polycrystalline semiconductor film using the second mask, thereby forming a semiconductor island by the third pattern;

wherein in the step of irradiating laser light to the amorphous semiconductor film, a pair of source/drain regions are formed by the first impurity-doped regions and the first alignment marks are formed by the second impurity-doped regions in the polycrystalline semiconductor film;

and wherein in the step of selectively etching the polycrystalline semiconductor film, the pair of source/drain regions are included in the semiconductor island, and the first alignment marks are excluded from the semiconductor island.

With the method of fabricating a semiconductor device according to the second aspect of the present invention, the surface-etched first impurity-doped regions and the surface-etched second impurity-doped regions are obtained by conducting only the series of operations of formation, exposure and development of a resist film for the first mask, impurity implantation to the amorphous semiconductor film and selective etching of the amorphous semiconductor film. By irradiating laser light to the amorphous semiconductor film, the surface-etched first impurity-doped regions are turned to the pair of source/drain regions of the TFT and at the same time, the surface-etched second impurity-doped regions are turned to the first alignment marks.

Moreover, by irradiating laser light to the amorphous semiconductor film including the surface-etched first and second impurity-doped regions, the amorphous semiconductor film is crystallized to form the polycrystalline semiconductor film and at the same time, the impurity implanted into the first and second impurity-doped regions is activated. Therefore, no additional process step is required for activating the said impurity.

Accordingly, the total number of the required fabrication process steps for a semiconductor device (e.g., the semiconductor device according to the first aspect of the invention) is decreased. This means that the fabrication cost thereof is lowered.

Furthermore, since the surfaces of the first and second impurity-doped regions in the amorphous semiconductor film are selectively etched away using the first mask, removal of the heavy-metal impurity that has been implanted into the surface of the amorphous semiconductor film along with the desired impurity is ensured. Therefore, fluctuation of initial characteristics of the TFT (i.e., the semiconductor device) formed by using the pair of source/drain regions is improved and its reliability is raised as well, compared with the conventional method where the heavy-metal impurity is not removed.

In a preferred embodiment of the method according to the second aspect of the present invention, in the step of selectively etching the polycrystalline semiconductor film using the second mask, alignment is conducted using the first alignment marks. In this embodiment, there is an additional advantage that the semiconductor island can be formed at higher alignment accuracy than ever.

In another preferred embodiment of the method according to the second aspect of the present invention, the second mask has a fourth pattern for second alignment marks in addition to the third pattern for the semiconductor island. In the step of selectively etching the polycrystalline semiconductor film using the second mask to form the semiconductor island, second alignment marks are formed near the semiconductor island by the fourth pattern. In this embodiment, unlike the structure as disclosed in the above-described Publication No. 2003-332349 that the alignment marks are disposed on the periphery of the substrate, the first alignment marks are formed near the pair of source/drain regions in the polycrystalline semiconductor film, and the second alignment marks are formed outside and near the semiconductor island. Therefore, the second alignment marks can be used for alignment or positioning of an upper (i.e., a higher level) pattern with respect to the semiconductor island. Consequently, there is an additional advantage that higher alignment accuracy than ever is obtainable for the upper pattern.

In still another preferred embodiment of the method according to the second aspect of the present invention, a step of implanting an impurity for threshold adjustment into the surface of the amorphous semiconductor film is additionally provided. This additional step is carried out before the step of irradiating laser light to the amorphous semiconductor film. It is preferred that this additional step is carried out after the first mask is removed. However, the impurity for threshold adjustment may be selectively implanted into the channel region of the TFT using a suitable mask. In this embodiment, there is an additional advantage that the threshold of the TFT can be adjusted or controlled.

In a further preferred embodiment of the method according to the second aspect of the present invention, a step of implanting an impurity for LDD structure formation into the surface of the amorphous semiconductor film is additionally provided. This additional step is carried out before the step of irradiating laser light to the amorphous semiconductor film. In this embodiment, there is an additional advantage that the TFT with the LDD structure can be formed.

According to a third aspect of the present invention, a method of fabricating a semiconductor device with a TFT of a first conductivity type and a TFT of a second conductivity type is provided. This method comprises the steps of:

forming an amorphous semiconductor film directly on a substrate or over a substrate with an intervening backing film;

forming a first mask on the amorphous semiconductor film, the first mask having a first pattern for source/drain regions of a first TFT of a first conductivity type and a second pattern for first alignment marks;

selectively implanting an impurity of the first conductivity type into the amorphous semiconductor film using the first mask, thereby forming first impurity-doped regions by the first pattern and second impurity-doped regions by the second pattern;

selectively etching surfaces of the first impurity-doped regions and surfaces of the second impurity-doped regions using the first mask;

forming a second mask on the amorphous semiconductor film, the second mask having a third pattern for source/drain regions of a second TFT of a second conductivity type;

selectively implanting an impurity of the second conductivity type into the amorphous semiconductor film using the second mask, thereby forming third impurity-doped regions by the third pattern;

irradiating laser light to the amorphous semiconductor film including the surface-etched first impurity-doped regions, the surface-etched second impurity-doped regions, and the third impurity-doped regions, thereby crystallizing the amorphous semiconductor film to form a polycrystalline semiconductor film and activating the impurities implanted into the first impurity-doped regions, the second impurity-doped regions, and the third impurity-doped regions;

forming a third mask on the polycrystalline semiconductor film, the third mask having a fourth pattern for first and second semiconductor islands; and selectively etching the polycrystalline semiconductor film using the third mask, thereby forming a first semiconductor island for the first TFT and a second semiconductor island for the second TFT by the fourth pattern;

wherein in the step of irradiating laser light to the amorphous semiconductor film, a pair of source/drain regions of the first TFT is formed by the first impurity-doped regions, first alignment marks are formed by the second impurity-doped regions, and a pair of source/drain regions of the second TFT are formed by the third impurity-doped regions in the polycrystalline semiconductor film;

and wherein in the step of selectively etching the polycrystalline semiconductor film, the pair of source/drain regions of the first TFT are included in the first semiconductor island, the pair of source/drain regions of the second TFT are included in the second semiconductor island, and the first alignment marks are excluded from the first and second semiconductor islands.

With the method of fabricating a semiconductor device according to the third aspect of the present invention, the surface-etched first and second impurity-doped regions are obtained by conducting the series of operations of formation, exposure and development of a resist film for the first mask for the first TFT of the first conductivity type, impurity implantation of the first conductivity type impurity to the amorphous semiconductor film, and selective etching of the amorphous semiconductor film. The third impurity-doped regions are obtained by conducting the series of operations of formation, exposure and development of a resist film for the second mask for the second TFT of the second conductivity type, impurity implantation of the second conductivity type impurity to the amorphous semiconductor film. In addition, by irradiating laser light to the amorphous semiconductor film, the surface-etched first impurity-doped regions are turned to the pair of source/drain regions of the first TFT, the surface-etched second impurity-doped regions are turned to the first alignment marks, and the third impurity-doped regions are turned to the pair of source/drain regions of the second TFT.

Moreover, by irradiating laser light to the amorphous semiconductor film including the surface-etched first and second impurity-doped regions and the third impurity-doped regions, the amorphous semiconductor film is crystallized to form the polycrystalline semiconductor film and at the same time, the first conductivity type impurity implanted into the first and second impurity-doped regions and the second conductivity type impurity implanted into the third impurity-doped regions are activated. Therefore, no additional process step is required for activating the said impurities.

Accordingly, the total number of the required fabrication process steps for a semiconductor device (e.g., the semiconductor device according to the first aspect of the invention) is decreased. This means that the fabrication cost thereof is lowered.

Furthermore, since the surfaces of the first and second impurity-doped regions in the amorphous semiconductor film are selectively etched away using the first mask, removal of the heavy-metal impurity that has been implanted into the surface of the amorphous semiconductor film along with the desired impurity is ensured. Therefore, fluctuation of initial characteristics of the first TFT formed by using the corresponding pair of source/drain regions is improved and its reliability is raised as well, compared with the conventional method where the heavy-metal impurity is not removed.

Thus, because of substantially the same reason as the method according to the second aspect, the same advantages as those of the method according to the second aspect are obtained.

In the method according to the third aspect, the first alignment marks can be commonly used for the first and second TFTs and therefore, the second mask does not have a pattern for alignment marks corresponding to the first alignment marks. However, needless to say, the second mask may have a pattern for alignment marks corresponding to the first alignment marks. This is applicable to the second alignment marks.

In a preferred embodiment of the method according to the third aspect of the present invention, in the step of selectively etching the polycrystalline semiconductor film using the third mask, alignment is conducted using the first alignment marks. In this embodiment, there is an additional advantage that the first and second semiconductor islands can be formed at higher alignment accuracy than ever.

In another preferred embodiment of the method according to the third aspect of the present invention, the third mask has a fifth pattern for second alignment marks in addition to the fourth pattern for semiconductor islands. In the step of selectively etching the polycrystalline semiconductor film using the third mask to form the first and second semiconductor islands, second alignment marks are formed near the first and second semiconductor islands by the fifth pattern. In this embodiment, unlike the structure as disclosed in the above-described Publication No. 2003-332349 that the alignment marks are disposed on the periphery of the substrate, the first alignment marks are formed near the two pairs of source/drain regions of the first and second TFTs in the polycrystalline semiconductor film, and the second alignment marks are formed outside and near the first and second semiconductor islands. Therefore, the second alignment marks may be used for alignment or positioning of an upper (i.e., a higher level) pattern with respect to the first and second semiconductor islands. Consequently, there is an additional advantage that higher alignment accuracy than ever is obtainable for the upper pattern.

In still another preferred embodiment of the method according to the third aspect of the present invention, a step of implanting an impurity for threshold adjustment into the surface of the amorphous semiconductor film is additionally provided. This additional step is carried out before the step of irradiating laser light to the amorphous semiconductor film. This additional step may be carried out in such a way that the impurity for threshold adjustment is implanted into only the channel region of the amorphous semiconductor film using a suitable mask, or the impurity for threshold adjustment is implanted into the whole surface of the amorphous semiconductor film. In this embodiment, there is an additional advantage that the threshold of the first and second TFTs is adjustable or controllable.

BRIEF DESCRIPTION OF THE DRAWINGS

In order that the present invention may be readily carried into effect, it will now be described with reference to the accompanying drawings.

FIG. 1A is an enlarged, partial cross-sectional view showing the schematic structure of a semiconductor device according to a first embodiment of the present invention.

FIG. 1B is a plan view showing the schematic layout of the island-shaped polysilicon film (i.e., polysilicon island) and the second alignment marks of the semiconductor device according to the first embodiment of FIG. 1A.

FIGS. 2A to 2M are partial cross-sectional views showing a method of fabricating the semiconductor device according to the first embodiment of the present invention, respectively.

FIGS. 5A to 5L are partial cross-sectional views showing a method of fabricating a semiconductor device according to a fourth embodiment of the present invention, respectively.

DETAILED DESCRIPTION OF THE PREFERRED EMBODIMENTS

Figure 2A:

Preferred embodiments of the present invention will be described in detail below while referring to the drawings attached.

First Embodiment

[Structure of Semiconductor Device]
FIG. 1A shows the schematic structure of a semiconductor device 1 according to a first embodiment of the present invention, and FIG. 1B shows the schematic layout of an island-shaped polysilicon film (i.e., polysilicon island) and second alignment marks thereof.

As shown in FIGS. 1A and 1B, the semiconductor device 1 of the first embodiment comprises a substrate 10 and an insulating backing film 12 formed on the substrate 10. Here, the substrate 10 is formed by a rectangular glass plate. On the backing film 12, a patterned polysilicon film 45 is formed to have an island-like shape, and a pair of second alignment marks 47a and 47b is formed. This polysilicon film 45 may be termed the "polysilicon island" below. A channel region 20c is formed at the middle of the polysilicon island 45. A pair of source/drain regions (S/D regions) 20a and 20b is formed at each side of the channel region 20c in the island 45. Thus, the channel region 20c is sandwiched by the pair of S/D regions 20a and 20b. On the left side of the S/D region 20a, the second alignment mark 47a is disposed apart from the S/D region 20a. On the right side of the S/D region 20b, the second alignment mark 47b is disposed apart from the S/D region 20b.

The thickness Ta of the S/D region 20a and the thickness Tb of the S/D region 20b are less than the thickness Tc of the polysilicon island 45. In other words, Ta=Tb>Tc. The thickness of the second alignment marks 47a and 47b is equal to the thickness Tc of the island 45.

The difference $\Delta Ta$ (=Tc−Ta) between the thickness Tc of the island 45 and the thickness Ta of the S/D region 20a and the difference $\Delta Tb$ (=Tc−Tb) between the thickness Tc of the island 45 and the thickness Tb of the S/D region 20b are set at values in the range from 10 angstrom to 100 angstrom, respectively. This means that 10 angstrom$\leq \Delta Ta \leq$100 angstrom 10 angstrom$\leq \Delta Tb \leq$100 angstrom, and $\Delta Ta = \Delta Tb$.

The reasons why $\Delta Ta$ and $\Delta Tb$ are set in the range from 10 angstrom to 100 angstrom are as follows:

The reason for the minimum value of $\Delta Ta$ and $\Delta Tb$ being 10 angstrom is that the minimum readable depth (i.e., the minimum readable thickness difference) of alignment marks (which are formed from the same polysilicon film as the island 45) by using an exposure apparatus is 10 angstrom.

The reason for the maximum value of $\Delta Ta$ and $\Delta Tb$ being 100 angstrom is as follows: It is supposed that the polysilicon island 45 is formed by crystallization of an a-Si film by the excimer laser annealing method and patterning of the a-Si film thus crystallized, and alignment marks are formed by the same polysilicon film as the island 45. In this case, the maximum possible depth (i.e., the maximum possible thickness difference) of the alignment marks under the condition that the shape of the alignment marks can be maintained at a level where the said alignment marks are readable with an exposure apparatus is 100 angstrom.

If these conditions for ΔTa and ΔTb are satisfied, the thicknesses of the second alignment marks 47a and 47b may not be equal to the thickness Tc of the polysilicon island 45. Also, the difference ΔTa and ΔTb may be different from each other (i.e., ΔTa≠ΔTb).

The polysilicon island 45 and the pair of second alignment marks 47a and 47b are covered with a gate insulating film 50, the film 50 being formed on the backing film 12. The gate insulating film 50 covers the entire surface of the substrate 10. On the gate insulating film 50, a gate electrode/line 55 is formed. The gate electrode/line 55 is overlapped with the whole channel region 20c of the island 45, where the overlapped part serves as the gate electrode of the TFT and the remainder serves as the gate line. The gate electrode/line 55 is covered with a thick interlayer insulating film 60 formed on the gate insulating film 50. The interlayer insulating film 60 covers the entire surface of the substrate 10. The surface of the film 60 is planarized.

The pair of S/D regions 20a and 20b, the gate insulating film 50, and the gate electrode/line 55 constitute the TFT.

On the interlayer insulating film 60, a pair of source/drain lines (S/D lines) 70a and 70b is formed. The S/D line 70a is mechanically and electrically connected to the S/D region 20a by way of a conductive plug filled in a contact hole 65a that penetrates the gate insulating film 50 and the interlayer insulating film 60. Similarly, the S/D line 70b is mechanically and electrically connected to the S/D region 20b by way of a conductive plug filled in a contact hole 65b that penetrates the gate insulating film 50 and the interlayer insulating film 60.

As explained above, with the semiconductor device 1 according to the first embodiment of the invention shown in FIGS. 1A and 1B, the thicknesses Ta and Tb of the pair of S/D regions 20a and 20b are set to be smaller than the thickness Tc of the remainder of the polysilicon island 45 (i.e., the channel region 20c) by an optional value in the range from 10 angstrom to 100 angstrom. This means that only the surfaces of the S/D regions 20a and 20b of the polysilicon island 45 are selectively removed.

Therefore, when a desired impurity or dopant is introduced into the portions (i.e., the S/D formation regions) of the polysilicon island 45 to be formed as the S/D regions 20a and 20b later, heavy metal impurity, which has been implanted into the island 45 along with the desired impurity, is removed by selective removal of the surfaces of the S/D regions 20a and 20b.

Accordingly, when the crystallization of the a-Si film and the activation of the implanted impurity are carried out simultaneously by the excimer laser annealing, there is no possibility that the undesired heavy-metal impurity existing in the a-Si film will diffuse into the inside of the S/D regions 20a and 20b. As a result, compared with the conventional method where the heavy-metal impurity is not removed, the initial characteristic fluctuation of the TFT including the S/D regions 20a and 20b (i.e., the semiconductor device 1) is improved, and its reliability is raised as well. Thus, the operation characteristics and reliability of the TFT (i.e., the device 1) can be improved.

Moreover, unlike the structure as disclosed in the above-described Publication No. 2003-332349 where the alignment marks are disposed on the periphery of the substrate 10, the pair of second alignment marks 47a and 47b are disposed outside the polysilicon island 45 and are respectively placed near the pair of S/D regions 20a and 20b in the island 45. (In other words, the pair of second alignment marks 47a and 47b are provided for each of the TFTs formed on the substrate 10.)

Therefore, the second alignment marks 47a and 47b, which are disposed in the "a-Si film formation region" of the structure in the above-described Publication No. 2003-332349, may be used for alignment or positioning of an upper or higher-level pattern or patterns. Consequently, higher alignment accuracy than ever is obtained for the upper patterns such as the pattern for the gate electrode/line 55.

Moreover, by forming the pattern for impurity implantation and the pattern for alignment mark formation through a single set of exposure and development processes for a mask and by simultaneously conducting the crystallization of the a-Si film and the activation of the impurity implanted into the a-Si film, the number of the exposure/development processes can be reduced. As a result, the total number of the necessary process steps for the device 1 can be reduced. This means that the fabrication cost of the device 1 can be lowered furthermore.

In the above-described semiconductor device 1, the pair of second alignment marks 47a and 47b may be omitted, although higher alignment accuracy than ever is not obtained in the subsequent steps such as the step of forming the gate electrode/line 55.

[Method of Fabricating Semiconductor Device]

Next, a method of fabricating the semiconductor device 1 according to the first embodiment will be explained below with reference to FIGS. 2A to 2M.

First, as shown in FIG. 2A, the insulating backing film 12 is formed on the glass plate (i.e., the substrate) 10 with a desired size. This backing film 12 is provided to prevent the films formed on or over the glass plate 10 from being contaminated by impurities existing in the plate 10. The backing film 12 is formed by a silicon dioxide ($SiO_2$) film, a silicon nitride ($SiN_x$) film, a silicon oxynitride (SiON) film, or a stacked combination of a $SiO_2$ film and a $SiN_x$ film. The thickness of the backing film 12 is optionally set at a value in the range from 1000 angstrom to 5000 angstrom. Here, the backing film 12 is formed by a $SiO_2$ film with a thickness of 5000 angstrom.

Figure 2B:
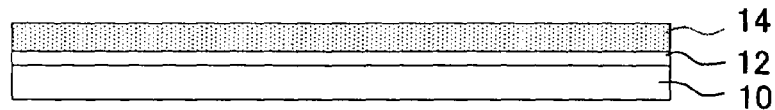

Next, as shown in FIG. 2B, an a-Si film 14 is formed on the backing film 12 by Low-Pressure Chemical Vapor Deposition (LPCVD) or Plasma-Enhanced CVD (PECVD). Since the a-Si film 14 is used as an active layer of the TFT after crystallization, it is preferred that the thickness of the film 14 is as small as possible from the viewpoint of suppressing the leakage current. However, considering the process margin for the subsequent process of crystallizing the a-Si film 14, it is preferred that the thickness of the film 14 is set at a value in the range from 300 angstrom to 3000 angstrom. Here, the thickness of the film 14 is set to 600 angstrom.

Figure 2C:
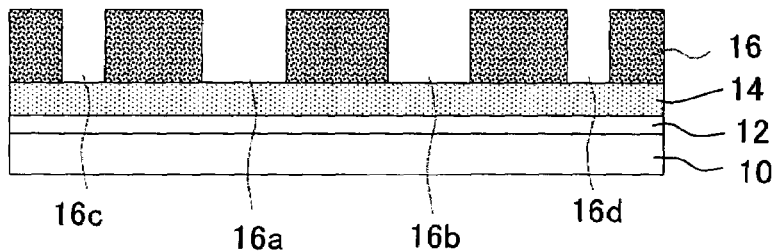

Next, as shown in FIG. 2C, a photosensitive resist film with a desired thickness is formed on the a-Si film 14 by coating. Then, the photosensitive resist film is patterned by exposure and development, thereby forming a mask 16 for forming a pair of first alignment marks 18a and 18b and the pair of S/D regions 20a and 20b. The mask 16 has openings 16c and 16d corresponding to the pair of first alignment marks 18a and 18b, and openings 16a and 16b corresponding to the pair of S/D regions 20a and 20b.

Figure 2D:
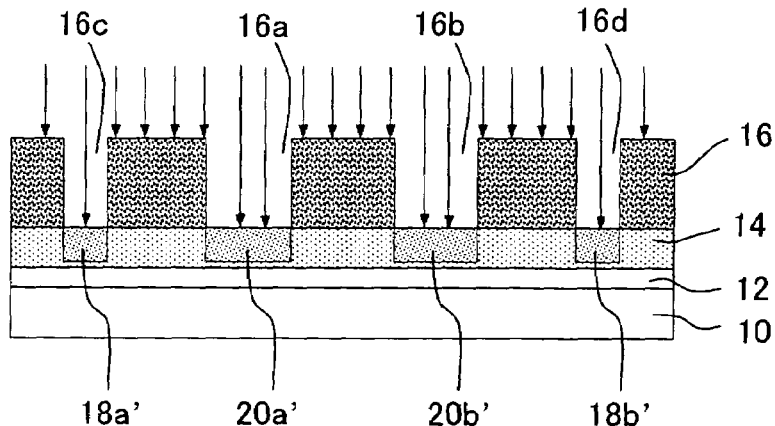

Next, as shown in FIG. 2D, a desired p-type impurity or dopant such as boron (B) is selectively introduced into the a-Si film 14 by ion implantation using the mask 16. In this ion-implantation process, the dose is set at $1 \times 10^{15}$ $cm^{-2}$. As a result, desired p-type dopant ions are selectively implanted into the a-Si film 14 by way of the openings 16a, 16b, 16c, and 16d of the mask 16. Thus, a pair of p-type impurity-doped regions 20a' and 20b' is formed and at the same time, a pair of p-type impurity-doped regions 18a' and 18b' is formed in the a-Si film 14. Since the pair of impurity-doped regions 18a' and 18b' is simultaneously formed along with the pair of impurity-doped regions 20a' and 20b', this method is different from the method disclosed in the above-described Publication No. 2003-332349 where the alignment marks are formed only on the periphery of the substrate. Thus, in the method of the first embodiment, there is an advantage that alignment accuracy is improved in the subsequent exposure process of the a-Si film 14 for forming the polysilicon island 45 because the impurity-doped regions 18a' and 18b' (which will be the first alignment marks 18a and 18b later) are formed in this step.

The implantation depth of the p-type impurity ions in the step of FIG. 2D is set at almost the whole thickness of the a-Si film 14. Thus, the implanted ions are distributed in the whole thickness of the film 14 due to the subsequent activation process of the said impurity ions.

The impurity-doped regions 18a' and 18b', which are respectively formed near the impurity-doped regions 20a' and 20b' by the ion-implantation step of FIG. 2D, do not affect the TFT characteristics. This is because the impurity-doped regions 18a' and 18b' are removed in a later process.

Figure 2E:
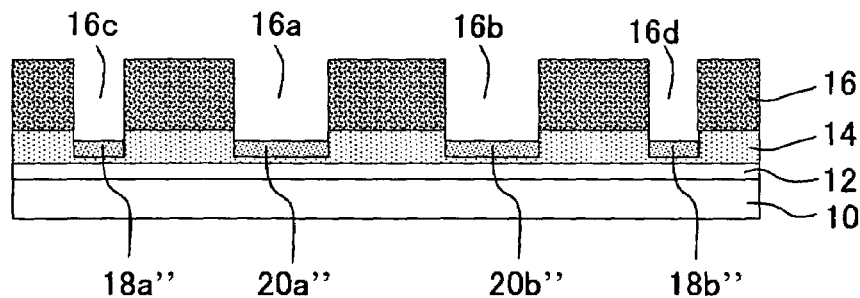

Next, as shown in FIG. 2E, the surfaces of the p-type impurity-doped regions 18a' and 18b' and those of the p-type impurity-doped regions 20a' and 20b' of the a-Si film 14 are selectively etched using the same mask 16. After the etching is completed, the mask 16 is removed. Here, the surface-etched impurity-doped regions 18a' and 18b' are denoted by 18a" and 18b", respectively. Similarly, the surface-etched impurity-doped regions 20a' and 20b' are denoted by 20a" and 20b", respectively.

The etching depth of the a-Si film 14 in the etching process of FIG. 2E is optionally set at a value in the range from 10 angstrom to 100 angstrom, the reason of which is as follows: Here, the etching depth is set at 50 angstrom.

(i) The minimum readable depth (i.e., the minimum value of the thickness differences ΔTa and ΔTb) of the first alignment marks 18a and 18b that can be read with an exposure apparatus is 10 angstrom.

(ii) When the a-Si film 14 is crystallized by the excimer laser annealing (ELA) method in a subsequent process explained later, the maximum possible depth (i.e., the maximum value of the thickness differences ΔTa and ΔTb) of the first alignment marks 18a and 18b under the condition that the shape of the first alignment marks 18a and 18b are maintained at a level where the marks 18a and 18b can be read with an exposure apparatus is 100 angstrom.

As explained above, by simply conducting the series of operations such as formation, exposure and development for the mask 16 and etching of the a-Si film 14 only once, the surface-etched p-type impurity-doped regions 18a", 18b", 20a" and 20b" are obtained.

As shown in FIG. 2E, the surfaces of the impurity-doped regions 20a" and 20b", which will be the S/D regions 20a and 20b later, are etched away. Thus, the unwanted heavy metal impurity introduced into the a-Si film 14 along with the desired impurity (i.e., boron) ions is removed. According to the inventors test, it was found that the initial characteristic fluctuation of the TFT (i.e., the semiconductor device 1) including the S/D regions 20a and 20b was improved by 10% or more, compared with the conventional method where the heavy metal impurity was not removed. In addition, it was found that reliability was improved as well. Specifically, the reliability was raised twice or more as much as the conventional method where the heavy metal impurity was not removed.

Figure 2F:
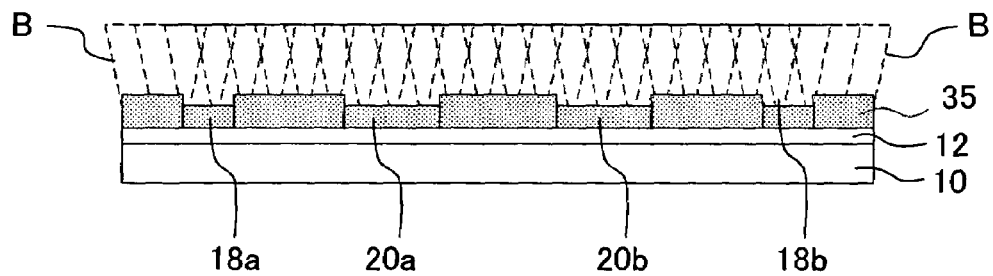

Next, as shown in FIG. 2F, excimer laser light B is irradiated to the whole surface of the a-Si film 14 (which includes the surface-etched impurity-doped regions 18a", 18b", 20a" and 20b") by the ELA method, thereby crystallizing the a-Si film 14. Thus, a polysilicon film 35 is obtained. At this time, the doped impurity (i.e., boron) in the impurity-doped regions 20a" and 20b" is activated and therefore, any additional activation process for the said doped impurity is not required. Moreover, due to the crystallization of the a-Si film 14, the p-type impurity-doped regions 18a" and 18b" are respectively turned to the first alignment marks 18a and 18b, and the p-type impurity-doped regions 20a" and 20b" are respectively turned to the p-type S/D regions 20a and 20b.

Figure 2G:
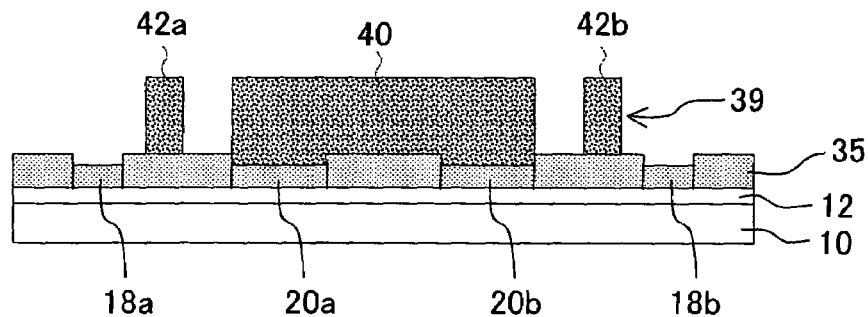

Next, as shown in FIG. 2G, a photosensitive resist film is formed on the polysilicon film 35 by the coating process and then, it is exposed and developed, thereby forming a mask 39 for the polysilicon island 45 and the second alignment marks 47a and 47b. The mask 39 has a pattern comprising the part 40 for forming the polysilicon island 45 and the parts 42a and 42b for forming the second alignment marks 47a and 47b, the remainder of the mask 39 being removed. Alignment of the mask 39 is carried out using the previously formed first alignment marks 18a and 18b. Since the first alignment marks 18a and 18b are respectively disposed near the S/D regions 20a and 20b, alignment of the mask 39 can be conducted at the accuracy of ±0.1 μm or less.

Here, for simplification of description, explanation is made such that one TFT (which includes the pair of S/D regions 20a and 20b and the gate electrode/line 55) is formed on the substrate 10. However, actually, many TFTs are arranged in a matrix array on the substrate 10. In this first embodiment of the invention, the first alignment marks 18a and 18b are respectively disposed near the S/D regions 20a and 20b of each the TFTs and thus, the first alignment marks 18a and 18b are arranged on the whole substrate 10 according to the arrangement of the S/D regions 20a and 20b. Accordingly, alignment of the TFTs can be conducted at the accuracy of ±0.1 μm or less. On the other hand, with the method disclosed in the Publication No. 2003-332349, the alignment marks are arranged only on the periphery of the substrate. Therefore, obtainable alignment accuracy of the TFTs will be ±0.3 μm or greater, which is considerably inferior to the said first embodiment of the invention.

Figure 2H:
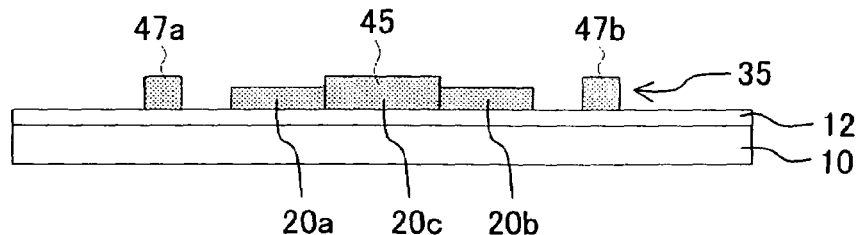

Next, as shown in FIG. 2H, the polysilicon film 35 is selectively etched using the mask 39, thereby forming the island-shaped polysilicon film 35, i.e., the polysilicon island 45. At the same time, the pair of second alignment marks 47a and 47b are formed by the polysilicon film 35 at each side of the polysilicon island 45. The second alignment marks 47a and 47b are apart from the island 45 and disposed near the same. The island 45 is formed to include the pair of S/D regions 20a and 20b and the channel region 20c and to exclude the second alignment marks 47a and 47b. The pair of first alignment marks 18a and 18b is removed in this step.

Figure 2I:
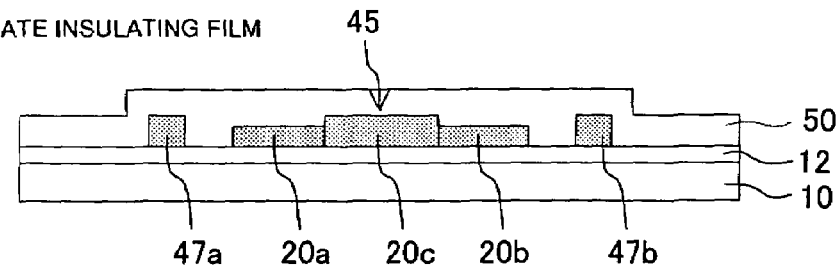

Next, as shown in FIG. 2I, the gate insulating film 50 is formed on the backing film 12 to cover the polysilicon island 45 and the second alignment marks 47a and 47b. The gate insulating film 50, which covers the whole surface of the substrate 10, has a thickness of 1000 angstrom. The gate insulating film 50 is formed by a $SiO_2$ film, a $SiN_x$ film, a SiON film, or a stacked combination of a $SiO_2$ film and a $SiN_x$ film. Here, the gate insulating film 50 is formed by a $SiO_2$ film.

Figure 2J:
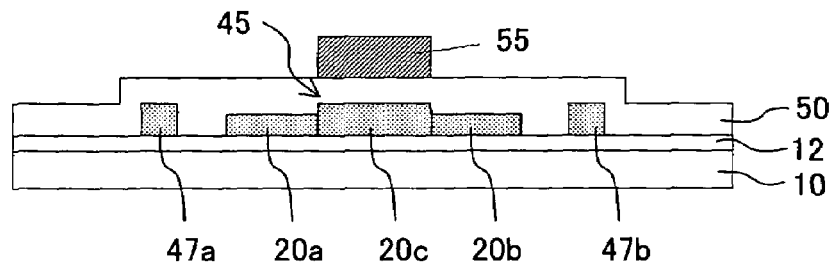

Next, as shown in FIG. 2J, the gate electrode/line 55 is formed on the gate insulating film 50 to be superposed on the channel region 20c. The gate electrode/line 55 may be made of a conductive material such as Si, Al, Cr, Mo, W, and WSi. Here, the gate electrode/line 55 is formed by a patterned Cr film with a thickness of 2000 angstrom. Alignment in the formation process of the gate electrode/line 55 is conducted using the polysilicon island 45 and the second alignment marks 47a and 47b.

Figure 2K:
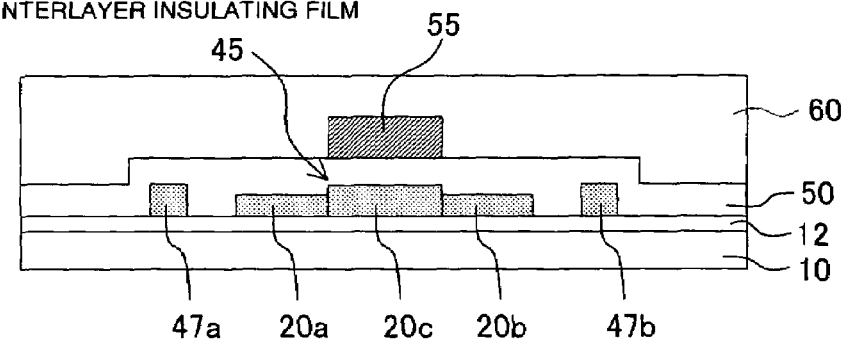

Next, as shown in FIG. 2K, the interlayer insulting film 60 is formed on the gate insulating film 50 to cover the gate electrode/line 55. The interlayer insulting film 60, which covers the whole surface of the substrate 10, is formed by a $SiO_2$ film with a thickness of 4000 angstrom. The surface of the interlayer insulting film 60 is then planarized by a known method.

Figure 2L:
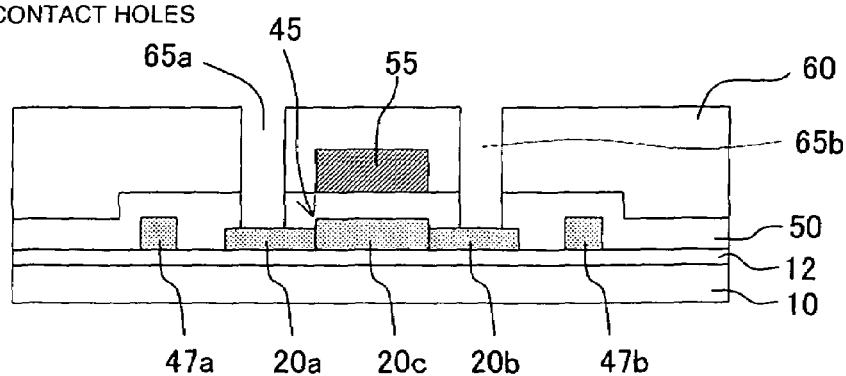

Next, as shown in FIG. 2L, a pair of contact holes 65a and 65b are formed to penetrate the interlayer insulting film 60 and the gate insulating film 50 by a known method. The holes 65a and 65b reach the S/D regions 20a and 20b of the polysilicon island 45, respectively.

Next, as shown in FIG. 2M, a metal film is deposited on the interlayer insulating film 60 and patterned by a known method, thereby forming a pair of S/D lines 70a and 70b on the interlayer insulating film 60. The S/D lines 70a and 70b are connected mechanically and electrically to the S/D regions 20a and 20b by way of the contact holes 65a and 65b, respectively. The structure of FIG. 2M is the same as that of FIG. 1A.

Through the above-explained process steps, the TFT having the polysilicon film 35 as the active layer (i.e., the polysilicon TFT) is completed on the substrate 10. As a result, the semiconductor device 1 according to the first embodiment is fabricated.

With the above-described method of fabricating the semiconductor device 1 according to the first embodiment, the surface-etched p-type impurity-doped regions 18a" and 18b" and the surface-etched p-type impurity-doped regions 20a" and 20b" are obtained by conducting the series of operations of formation, exposure and development of the resist film for the mask 16, impurity implantation to the a-Si film 14 and selective etching of the a-Si film 14 (FIGS. 2C to 2E) only once. Moreover, the impurity-doped a-Si film 14 is crystallized by irradiating the laser light B to the whole surface of the said a-Si film 14 to thereby form the polysilicon film 35 (FIG. 2F) and therefore, the p-type impurity or dopant (i.e., boron) implanted into the impurity-doped regions 20a" and 20b" (which will be the S/D regions 20a and 20b later) is activated. Accordingly, no additional process step is required for activating the said p-type implanted impurity. Accordingly, the total number of the required fabrication process steps for the semiconductor device 1 according to the first embodiment is decreased, and the fabrication cost of the device 1 is lowered.

Furthermore, since the surfaces of the p-type impurity-doped regions 20a" and 20b" (which will be the S/D regions 20a and 20b later) are selectively etched away (FIG. 2E), removal of the heavy-metal impurity that have been implanted into the a-Si film 14 along with the desired impurity (i.e., boron) is ensured. Therefore, fluctuation of initial characteristics of the TFT (i.e., the semiconductor device 1) including the pair of S/D regions 20a and 20b is improved and its reliability is raised as well, compared with the conventional method where the heavy-metal impurity is not removed. This means that the operation characteristic and reliability of the TFT (i.e., the device 1) are improved.

Additionally, unlike the structure as disclosed in the above-described Publication No. 2003-332349 where the alignment marks are disposed only on the periphery of the substrate, the first alignment marks 18a and 18b are formed near the pair of S/D regions 20a and 20b in the polysilicon film 35, and the second alignment marks 47a and 47b are formed outside and near the polysilicon island 45. Therefore, the first alignment marks 18a and 18b can be used for alignment or positioning of an upper pattern (e.g., the pattern for the gate electrode/line 55) with respect to that for the S/D regions 20a and 20b. Similarly, the second alignment marks 47a and 47b can be used for alignment or positioning of an upper pattern with respect to the island 45. Consequently, there is an additional advantage that higher alignment accuracy than ever is obtained for upper patterns.

Second Embodiment

[Method of Fabricating Semiconductor Device]

Next, a method of fabricating a semiconductor device according to a second embodiment of the invention will be explained below with reference to FIGS. 3A to 3I.

The method of the second embodiment corresponds to the one obtained by adding a process step of implanting an impurity for threshold adjustment into the channel region of the TFT to the method of the first embodiment. Therefore, the semiconductor device 1a fabricated by the method of the second embodiment corresponds to the one obtained by adding the impurity-doped region for threshold adjustment to the channel region of the TFT in the semiconductor device 1 of the first embodiment.

First, the process steps shown in FIGS. 2A to 2E in the method of the first embodiment are carried out. Thus, as shown in FIG. 2E, the surface-etched p-type impurity-doped regions 18a" and 18b" and the surface-etched p-type impurity-doped regions 20a" and 20b" are formed in the a-Si film 14. The etching depth of the a-Si film 14 in this etching process is optionally determined in the range from 10 angstrom to 100 angstrom, similar to the first embodiment. In this way, the surface-etched impurity-doped regions 18a" and 18b" and the surface-etched impurity-doped regions 20a" and 20b" are obtained by conducting the series of operations of formation, exposure and development of the resist film for the mask 16, impurity implantation to the a-Si film 14, and selective etching of the a-Si film 14 only once.

Figure 3A:
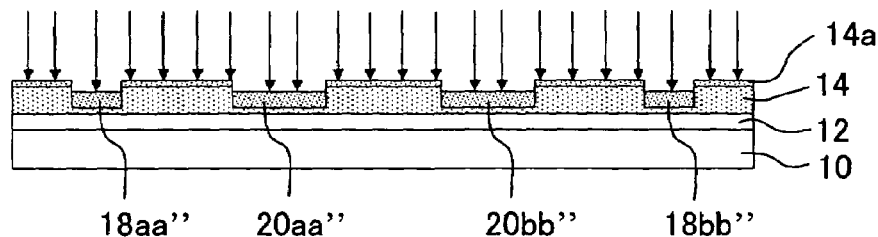
FIGS. 3A to 3I are partial cross-sectional views showing a method of fabricating a semiconductor device according to a second embodiment of the present invention, respectively.

Next, after removing the mask 16, a p-type impurity (e.g., boron) for threshold adjustment or control of the TFT is ion-implanted into the a-Si film 14 with a dose of $1 \times 10^{12}$ $cm^{-2}$, as shown in FIG. 3A. Since this ion-implantation process is conducted for the entire surface of the substrate 10, the said p-type impurity ions are implanted into not only the p-type impurity-doped regions 18a", 18b", 20a" and 20b" but also the remainder of a-Si film 14. Here, the p-type impurity-doped regions 18a" and 18b" into which the said p-type impurity has been introduced are denoted by 18aa" and 18bb", respectively. Similarly, the p-type impurity-doped regions 20a" and 20b" into which the said p-type impurity has been introduced are denoted by 20aa" and 20bb", respectively. The p-type impurity-doped regions of the a-Si film 14 other than the regions 18a", 18b", 20aa" and 20bb" are denoted by 14a. The state at this stage is shown in FIG. 3A.

The concentration of the p-type impurity implanted here for threshold control is lower than that of the impurity implanted into the regions 18a", 18b", 20aa" and 20bb" by one figure or digit or more. Therefore, the implanted p-type impurity for threshold control applies no effect to the operation of the TFT.

Figure 3B:
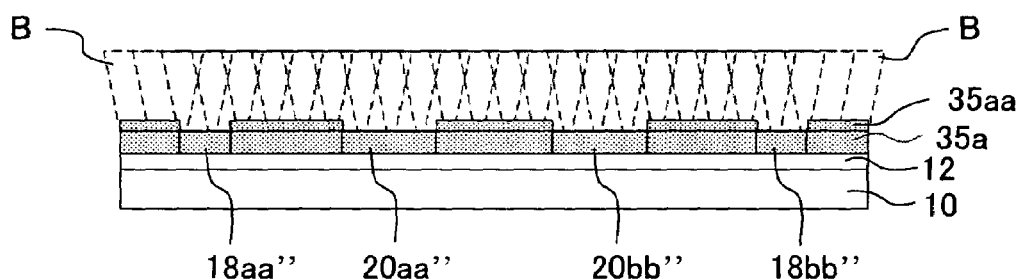

Next, similar to the step of FIG. 2F in the method of the first embodiment, excimer laser light B is irradiated to the whole surface of the a-Si film 14 (which includes the p-type impurity-doped regions 18aa'', 18bb'', 20aa'', 20bb'' and 14a) by the ELA method to crystallize the a-Si film 14, thereby forming a polysilicon film 35a, as shown in FIG. 3B. At this time, the p-type impurity (e.g., boron) existing in the impurity-doped regions 20aa'' and 20bb'' is activated by the laser light B and thus, no additional process step is necessary for activation of the said impurity. Also, due to crystallization of the a-Si film 14, the p-type impurity-doped regions 18aa'' and 18bb'' are respectively turned to first alignment marks 18aa and 18bb, and the p-type impurity-doped regions 20aa'' and 20bb'' are respectively turned to S/D regions 20aa and 20bb. The p-type impurity-doped region 14a is turned to an impurity-doped region 35aa.

Figure 3C:
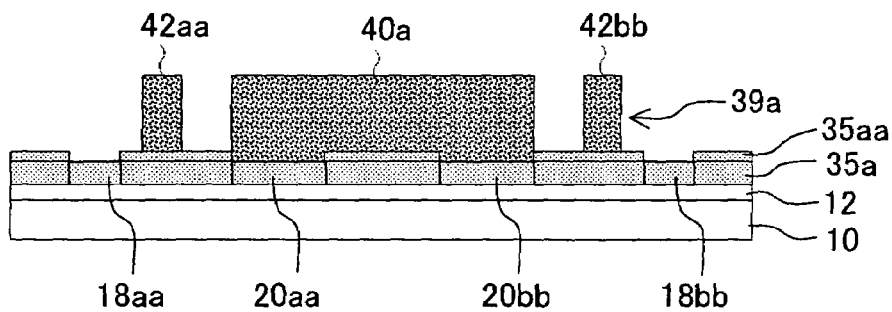

The subsequent process steps are the same as those of the method of the first embodiment. Specifically, as shown in FIG. 3C (see FIG. 2G), a photosensitive resist film is coated on the polysilicon film 35 and then, the photosensitive resist film is exposed and developed, thereby forming a mask 39a for forming a polysilicon island 45a and second alignment marks 47aa and 47bb. The mask 39a has a pattern comprising the part 40a for forming the polysilicon island 45a and the parts 42aa and 42bb for forming the second alignment marks 47aa and 47bb, the remainder of the mask 39a being removed. Alignment of the mask 39a is carried out using the previously formed first alignment marks 18aa and 18bb. Since the first alignment marks 18aa and 18bb are respectively disposed near the S/D regions 20aa and 20bb, alignment of the mask 39a can be conducted at the accuracy of ±0.1 μm or less over the whole substrate 10. This is superior to the method disclosed in the Publication No. 2003-332349 where the obtainable alignment accuracy of the TFTs will be ±0.3 μm or greater.

Figure 3D:
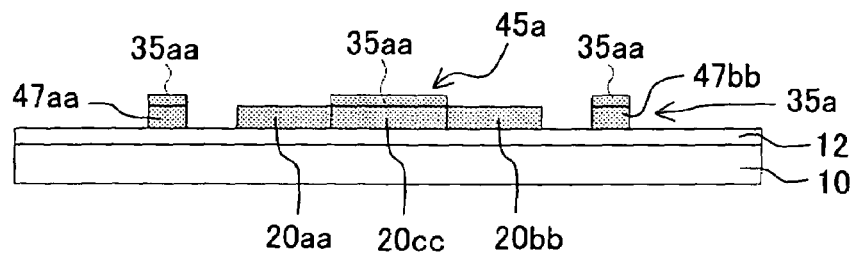

Next, as shown in FIG. 3D (see FIG. 2H), the polysilicon film 35a is selectively etched using the mask 39a, thereby forming the island-shaped polysilicon film 35a, i.e., the polysilicon island 45a. At the same time, the pair of second alignment marks 47aa and 47bb are formed at each side of the polysilicon island 45a near the island 45a. The island 45a includes the pair of p-type S/D regions 20aa and 20bb, and the channel region 20cc.

Figure 3E:
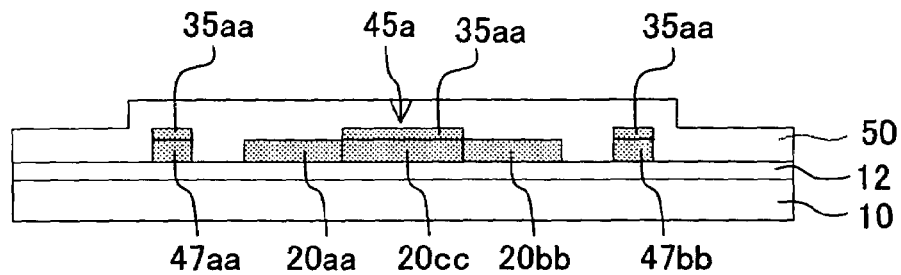

Next, as shown in FIG. 3E, (see FIG. 2I), the gate insulating film 50 (here, a $SiO_2$ film with a thickness of 1000 angstrom) is formed on the backing film 12 to cover the polysilicon island 45a and the second alignment marks 47aa and 47bb. The gate insulating film 50 covers the whole surface of the substrate 10. The material and thickness of the gate insulating film 50 may be the same as those in the method of the first embodiment.

Figure 3F:
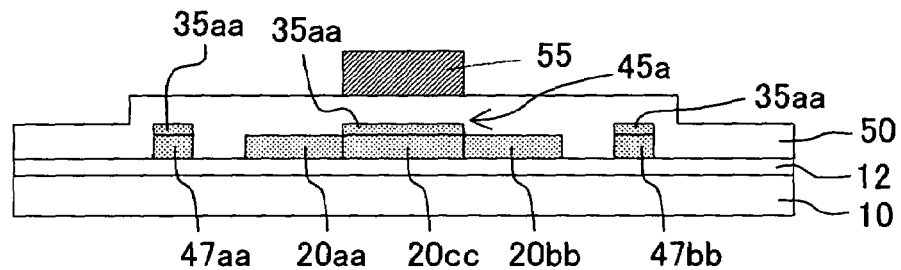

Next, as shown in FIG. 3F (see FIG. 2J), the gate electrode/line 55 is formed on the gate insulating film 50. Similar to the first embodiment, the gate electrode/line 55 is formed by a patterned Cr film with a thickness of 2000 angstrom. Alignment in the formation process of the gate electrode/line 55 is conducted using the polysilicon island 45a and the second alignment marks 47aa and 47bb.

Figure 3G:
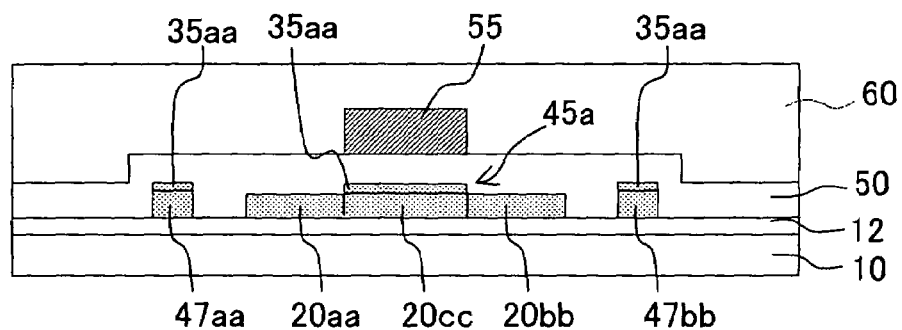

Next, as shown in FIG. 3G (see FIG. 2K), the interlayer insulting film 60 (which is formed by a $SiO_2$ film with a thickness of 4000 angstrom) is formed on the gate insulating film 50 to cover the gate electrode/line 55. The interlayer insulting film 60 covers the whole surface of the substrate 10. The surface of the interlayer insulting film 60 is then planarized by a known method.

Figure 3H:
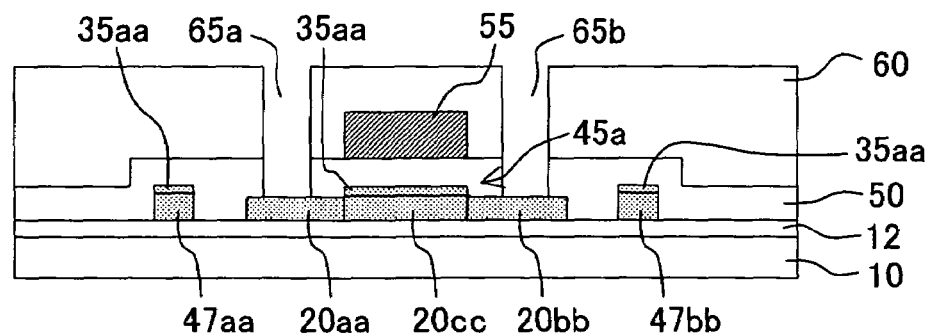

Next, as shown in FIG. 3H (see FIG. 2L), a pair of contact holes 65a and 65b is formed to penetrate the interlayer insulting film 60 and the gate insulating film 50 by a known method. The holes 65a and 65b reach the S/D regions 20aa and 20bb of the polysilicon island 45a, respectively.

Figure 3I:
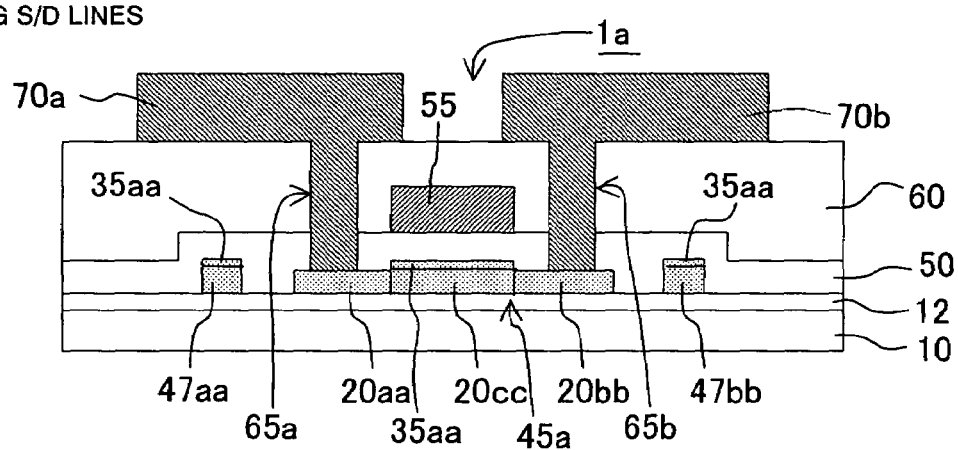

Next, as shown in FIG. 3I (see FIG. 2M), a metal film is deposited on the interlayer insulating film 60 and patterned by a known method, thereby forming a pair of S/D lines 70a and 70b on the interlayer insulating film 60. The S/D lines 70a and 70b are connected mechanically and electrically to the S/D regions 20aa and 20bb by way of the contact holes 65a and 65b, respectively.

Through the above-explained process steps, the TFT having the polysilicon film 35a as the active layer (i.e., the polysilicon TFT) is completed on the substrate 10. As a result, the semiconductor device 1a according to the second embodiment is fabricated. This device 1a is the same in structure as the device 1 of the first embodiment except that the p-type impurity-doped regions 35aa are respectively formed in the surface of the channel region 20cc and the surfaces of the second alignment marks 47aa and 47bb.

With the above-described method of fabricating the semiconductor device 1a according to the second embodiment, because of the same reasons as those in the method of the first embodiment, the same advantages (a), (b) and (c) as those of the first embodiment listed below are obtained.

(a) The total process steps required for fabrication of the semiconductor device 1a is reduced, and the fabrication cost thereof is lowered.

(b) The operation characteristic and reliability of the TFT (i.e., the device 1a) are improved.

(c) Higher alignment accuracy than ever is obtained for upper patterns.

In addition, the following advantage (d) is obtained as well in the second embodiment.

(d) The threshold of the TFT is well controlled or adjusted.

Third Embodiment

[Method of Fabricating Semiconductor Device]

Next, a method of fabricating a semiconductor device according to a third embodiment of the invention will be explained below with reference to FIGS. 4A to 4M.

The method of the third embodiment corresponds to the one obtained by forming TFTs of two different conductivity types (i.e., n channel and p channel) in the method of the first embodiment where TFTs of one conductivity type (i.e., n channel or p channel) are formed. Therefore, the semiconductor device 1b fabricated by the method of the third embodiment corresponds to the one obtained by converting the semiconductor device 1 of the first embodiment to the complimentary type.

Figure 4A:
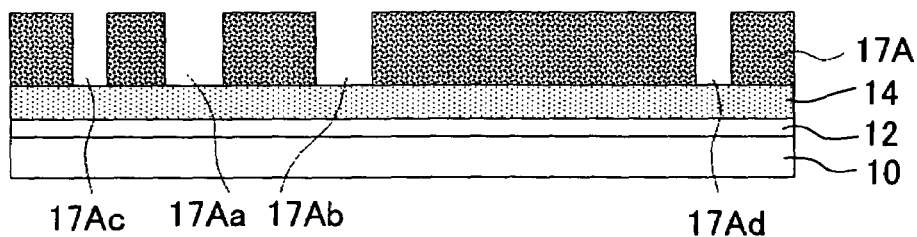
FIGS. 4A to 4M are partial cross-sectional views showing a method of fabricating a semiconductor device according to a third embodiment of the present invention, respectively.

First, as shown in FIG. 4A, an insulating backing film 12 (which is formed by a $SiO_2$ film with a thickness of 5000 angstrom) is formed on a glass plate (i.e., a substrate) 10 with a desired size. On the backing film 12, an a-Si film 14 (which is 600 angstrom in thickness) is formed. Thereafter, a photosensitive resist film with a desired thickness is formed on the a-Si film 14 by the coating method. The photosensitive resist film is then patterned by exposure and development, thereby forming a mask 17A for forming a pair of first alignment marks 19Aa and 19Ab and a pair of S/D regions 21Aa and 21Ab. These process steps are conducted by the same methods as those used in the first embodiment. The mask 17A has openings 17Ac and 17Ad corresponding to the pair of first alignment marks 19Aa and 19Ab, and openings 17Aa and 17Ab corresponding to the pair of S/D regions 21Aa and 21Ab.

Figure 4B:
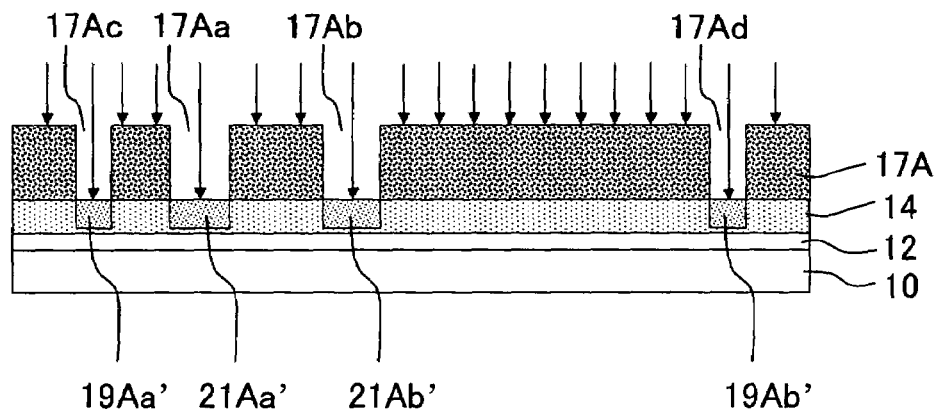

Next, as shown in FIG. 4B, a desired n-type impurity such as phosphorus (P) is selectively introduced into the a-Si film 14 by ion implantation using the mask 17A. In this ion-implantation process, the dose is set at $1\times10^{15}$ cm$^{-2}$. As a result, the n-type impurity ions are selectively implanted into the a-Si film 14 by way of the openings 17Aa, 17Ab, 17Ac and 17Ad of the mask 17A. Thus, in the a-Si film 14, a pair of n-type impurity-doped regions 21aA' and 21Ab' is formed and at the same time, a pair of n-type impurity-doped regions 19Aa' and 19Ab' is formed. Since the pair of n-type impurity-doped regions 19Aa' and 19Ab' is simultaneously formed along with the pair of n-type impurity-doped regions 21Aa' and 21Ab', this method is different from the method disclosed in the above-described Publication No. 2003-332349 where the alignment marks are formed only on the periphery of the substrate. As a result, there is an advantage that alignment accuracy is improved in the subsequent exposure process (for forming the polysilicon island 45) of the a-Si film 14, where the impurity-doped regions 19Aa' and 19Ab' (which will be the first alignment marks 19Aa and 19Ab later) are used for alignment.

The implantation depth of the n-type impurity ions (i.e., phosphorus ions) in the step of FIG. 4B is set at almost the whole thickness of the a-Si film 14. Thus, the implanted impurity ions are distributed in the whole thickness of the film 14 due to the subsequent activation process of the said impurity ions. Moreover, the impurity-doped regions 19Aa' and 19Ab' are respectively formed near the impurity-doped regions 21Aa' and 21Ab' by the ion-implantation step of FIG. 4B. However, the impurity-doped regions 19Aa' and 19Ab' do not affect the TFT characteristics. This is because these regions 19Aa' and 19Ab' are removed in a later process.

Figure 4C:
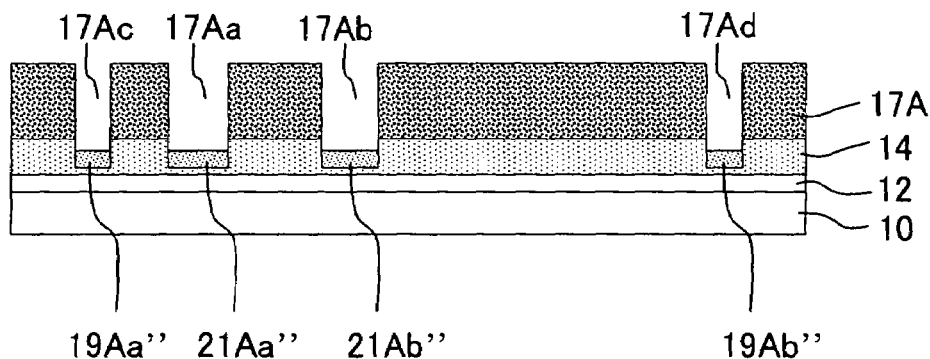

Next, as shown in FIG. 4C, the surfaces of the n-type impurity-doped regions 19Aa' and 19Ab' and those of the n-type impurity-doped regions 21Aa' and 21Ab' of the a-Si film 14 are selectively etched using the same mask 17A. After the etching process is completed, the mask 17A is removed. Here, the surface-etched impurity-doped regions 19Aa' and 19Ab' are denoted by 19Aa" and 19Ab", respectively. Similarly, the surface-etched impurity-doped regions 21Aa' and 21Ab' are denoted by 21Aa" and 21Ab", respectively.

The etching depth of the a-Si film 14 in the etching process of FIG. 4C is set at 50 angstrom similar to the first embodiment.

As explained above, by simply conducting the series of operations such as resist film formation, its exposure and development, and etching of the a-Si film 14 only once, the surface-etched n-type impurity-doped regions 19Aa", 19Ab", 21Aa" and 21Ab" are obtained in the a-Si film 14. Thereafter, the mask 17A is removed.

As shown in FIG. 4C, the surfaces of the n-type impurity-doped regions 21Aa" and 21Ab", which will be the n-type S/D regions 21Aa and 21Ab later, are etched away. Thus, the heavy metal impurity introduced into the a-Si film 14 along with the desired n-type impurity ions is removed. According to the inventors test, it was found that the initial characteristic fluctuation of the TFT including the S/D regions 21Aa and 21Ab was improved by 10% or more compared with the conventional method where the heavy metal impurity was not removed. In addition, it was found that the reliability of the TFT was raised twice or more as much as the conventional method where the heavy metal impurity was not removed.

Figure 4D:
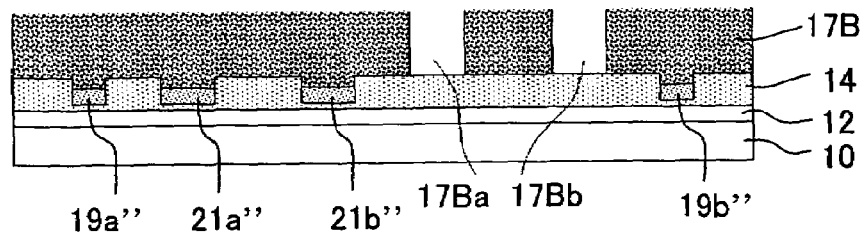

Next, as shown in FIG. 4D, a photosensitive resist mask with a desired thickness is formed on the a-Si film 14 and then, it is patterned by exposure and development, thereby forming a mask 17B for forming a p-type S/D regions 21Ba and 21Bb of a p-channel TFT. The method of forming the mask 17B is the same as that of the mask 17A. The mask 17B has openings 17Ba and 17Bb corresponding to the pair of p-type S/D regions 21Ba and 21Bb.

Figure 4E:
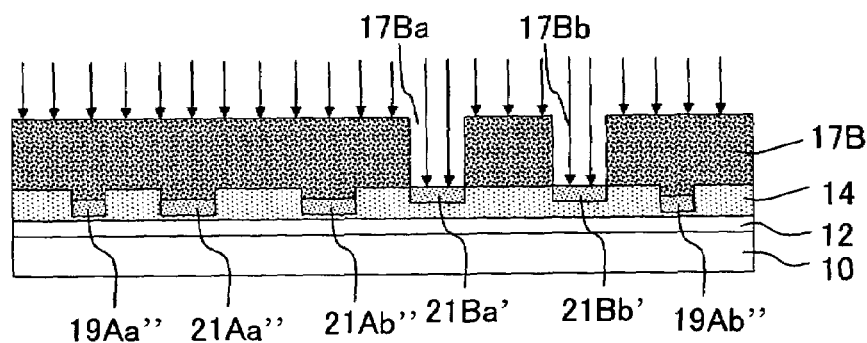

Next, as shown in FIG. 4E, a desired p-type impurity or dopant such as boron (B) is selectively introduced into the a-Si film 14 by ion implantation using the mask 17B. In this ion-implantation process, the dose is set at $1\times10^{15}$ cm$^{-2}$. As a result, the p-type impurity ions are selectively implanted into the a-Si film 14 by way of the openings 17Ba and 17Bb of the mask 17B. Thus, a pair of p-type impurity-doped regions 21Ba' and 21Bb' is formed between the impurity-doped regions 21b" and 19b". The surfaces of the impurity-doped regions 21Ba' and 21Bb' are not etched away.

The implantation depth of the p-type impurity ions (i.e., B ions) in the step of FIG. 4E is set at a value required for forming the p-type S/D regions 21Ba and 21Bb. This depth is shallower than that of the n-type impurity ions in the step of FIG. 4B. This is because the surfaces of the impurity-doped regions 21Ba' and 21Bb' were not etched away.

As explained above, by simply conducting the series of operations such as resist film formation, its exposure and development only once, the p-type impurity-doped regions 21Ba' and 21Bb' (the surfaces of which have not been etched away) are obtained in the a-Si film 14. Thereafter, the mask 17B is removed.

Figure 4F:
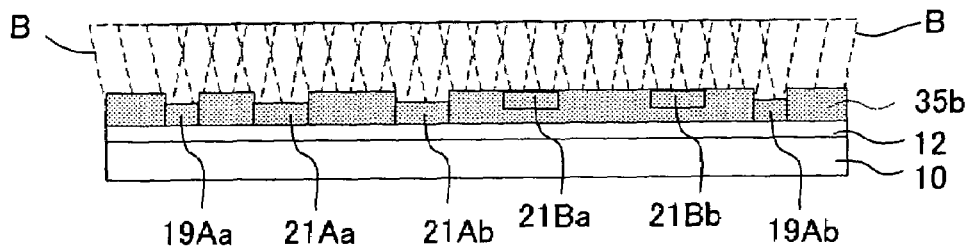

Next, as shown in FIG. 4F, excimer laser light B is irradiated to the whole surface of the a-Si film 14 (which includes the n-type impurity-doped regions 19Aa", 19Ab", 21Aa" and 21Ab" and the p-type impurity-doped regions 21Ba' and 21Bb') by the ELA method to crystallize the a-Si film 14, thereby forming a polysilicon film 35b. At this time, the n-type doped impurity (i.e., phosphorus) in the n-type impurity-doped regions 21Aa" and 21Ab" and the p-type doped impurity (i.e., boron) in the p-type impurity-doped regions 21Ba' and 21Bb' are activated and therefore, any additional activation process for the said doped impurities is not required. Moreover, due to the crystallization of the a-Si film 14, the n-type impurity-doped regions 19Aa" and 19Ab" are respectively turned to the first alignment marks 19Aa and 19Ab. Similarly, the n-type impurity-doped regions 21Aa" and 21Ab" are respectively turned to the n-type S/D regions 21Aa and 21Ab. The p-type impurity-doped regions 21Ba' and 21Bb' are respectively turned to the p-type S/D regions 21Ba and 21Bb.

Figure 4G:
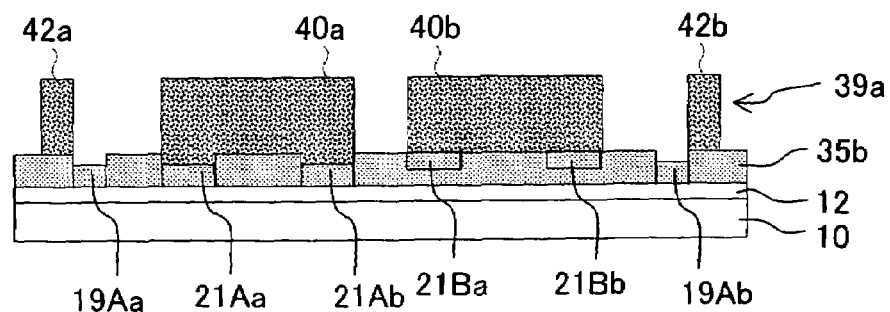

Next, as shown in FIG. 4G, a photosensitive resist film is formed on the polysilicon film 35b by the coating process and then, the photosensitive resist film is exposed and developed, thereby forming a mask 39a for forming polysilicon islands 45a and 45b and second alignment marks 47a and 47b. The mask 39a has a pattern comprising the part 40a for forming the polysilicon island 45a (for the n-channel TFT), the part 40b for forming the polysilicon island 45b (for the p-channel TFT) and the parts 42a and 42b for forming the second alignment marks 47a and 47b, the remainder of the mask 39a being removed. Alignment of the mask 39a is carried out using the previously formed first alignment marks 19Aa and 19Ab. Since the first alignment marks 19Aa and 19Ab are respectively disposed near the n-type S/D region 21Aa and the p-type S/D regions 21Bb, alignment of the mask 39a can be conducted at the accuracy of ±0.1 μm or less.

Here, for simplification of description, explanation is made such that a pair of n- and p-channel TFTs is formed on the substrate 10. However, actually, many pairs of n- and p-channel TFTs are arranged in a matrix array on the substrate 10. In this third embodiment of the invention, the first alignment marks 19Aa and 19Ab are respectively disposed near the n-type S/D region 21Aa and the p-type S/D region 21Bb and therefore, the first alignment marks 19Aa and 19Ab are arranged on the whole substrate 10 according to the arrangement or layout of the S/D regions 21Aa, 21Ab, 21Ba and 21Bb. Accordingly, alignment of the TFTs can be conducted at the accuracy of ±0.1 µm or less. On the other hand, with the method disclosed in the Publication No. 2003-332349, the alignment marks are arranged only on the periphery of the substrate. Thus, obtainable alignment accuracy of the TFTs will be ±0.3 µm or greater, which is considerably inferior to the said embodiment of the invention.

Figure 4H:
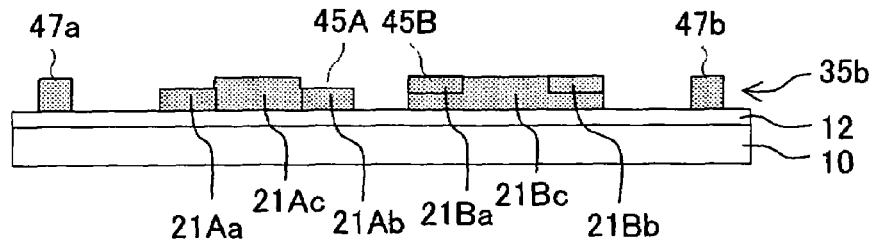

Next, as shown in FIG. 4H, the polysilicon film 35b is selectively etched using the mask 39a, thereby forming the island-shaped polysilicon film 35b, i.e., the polysilicon islands 45A and 45B. At the same time, the pair of second alignment marks 47a and 47b are formed by the polysilicon film 35b near the islands 45A and 45B, respectively. The island 45A includes the pair of n-type S/D regions 21Aa and 21Ab, and a channel region 21Ac disposed between the S/D regions 21Aa and 21Ab. Similarly, the island 45B includes the pair of p-type S/D regions 21Ba and 21Bb, and a channel region 21Bc disposed between the S/D regions 21Ba and 21Bb. As seen from FIG. 4H, the first alignment marks 19Aa and 19Ab are removed in this step.

Figure 4I:
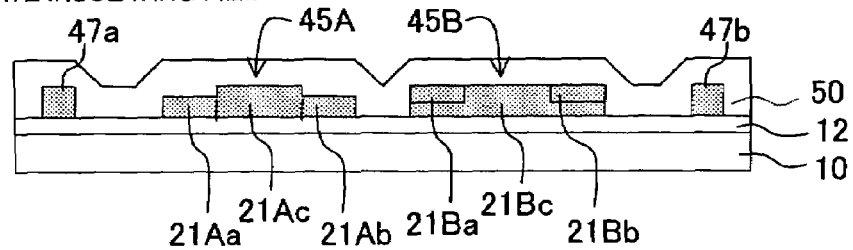

Next, as shown in FIG. 4I, a gate insulating film 50 (here, a $SiO_2$ film with a thickness of 1000 angstrom) is formed on the backing film 12 to cover the polysilicon islands 45A and 45B and the second alignment marks 47a and 47b. The gate insulating film 50 covers the whole surface of the substrate 10. The method of forming the film 50 may be the same as that of the first embodiment.

Figure 4J:
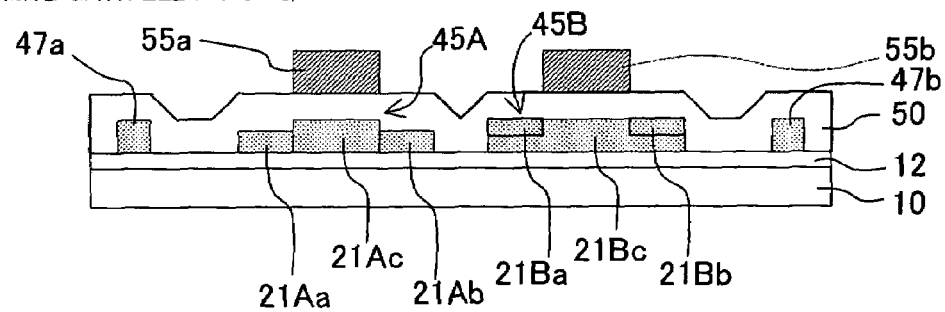

Next, as shown in FIG. 4J, gate electrode/lines 55a and 55b (here, which are made of a patterned Cr film with a thickness of 2000 angstrom) are formed on the gate insulating film 50 to be superposed on the channel regions 21Ac and 21Bc, respectively. The method of forming the gate electrode/lines 55a and 55b may be the same as that of the first embodiment. Alignment in this process is conducted using the polysilicon islands 45A and 45B and the second alignment marks 47a and 47b.

Figure 4K:
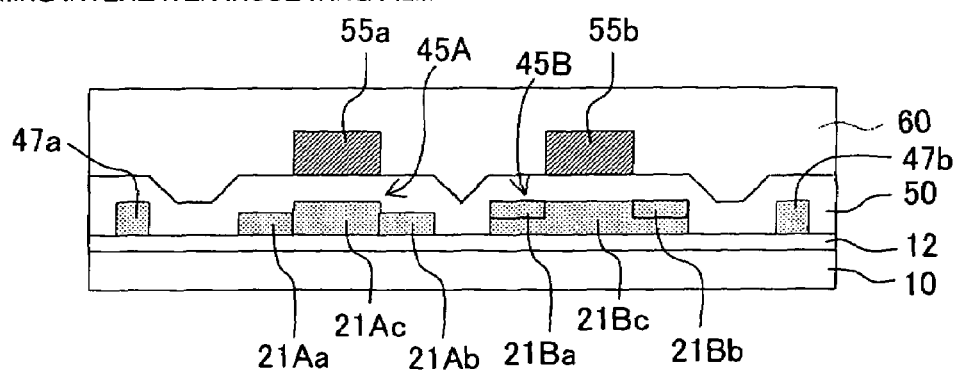

Next, as shown in FIG. 4K, an interlayer insulting film 60 (here, a $SiO_2$ film with a thickness of 4000 angstrom) is formed on the gate insulating film 50 to cover the gate electrode/lines 55a and 55b. The interlayer insulting film 60 covers the whole surface of the substrate 10. The surface of the interlayer insulting film 60 is then planarized by a known method.

Figure 4L:
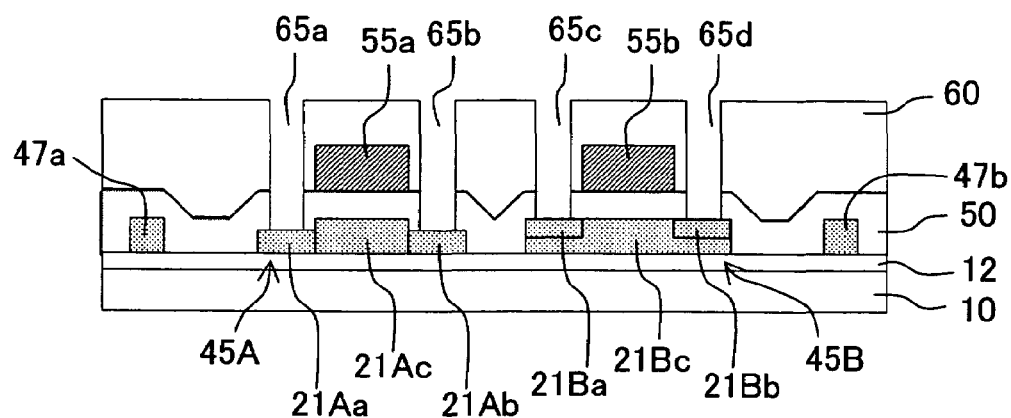

Next, as shown in FIG. 4L, a pair of contact holes 65a and 65b and a pair of contact holes 65c and 65d are formed to penetrate the interlayer insulting film 60 and the gate insulating film 50 by a known method. The holes 65a and 65b reach the n-type S/D regions 21Aa and 21Ab of the polysilicon island 45A, respectively. The holes 65c and 65d reach the p-type S/D regions 21Ba and 21Bb of the polysilicon island 45B, respectively.

Figure 4M:
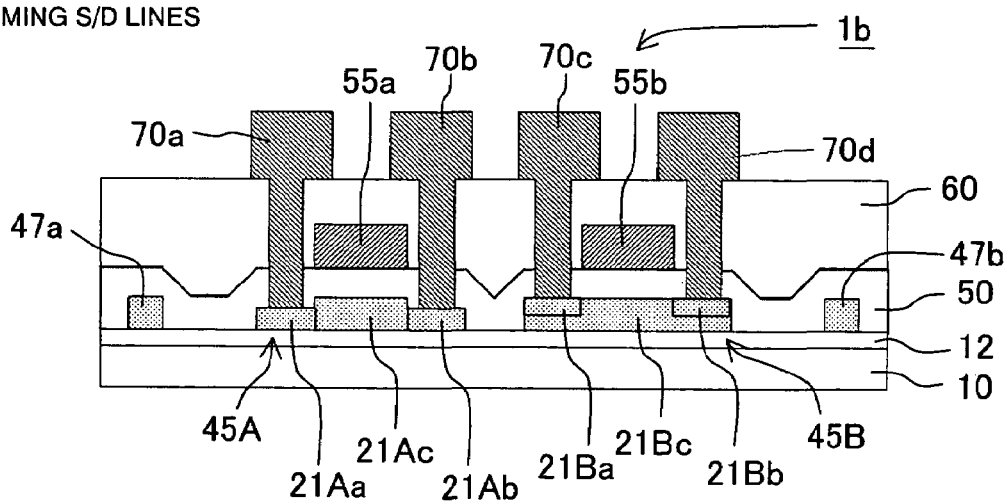

Next, as shown in FIG. 4M, a metal film is deposited on the interlayer insulating film 60 and patterned by a known method, thereby forming a pair of S/D lines 70a and 70b and a pair of S/D lines 70c and 70d on the interlayer insulating film 60. The S/D lines 70a and 70b are connected mechanically and electrically to the n-type S/D regions 21Aa and 21Ab by way of the contact holes 65a and 65b, respectively. The S/D lines 70c and 70d are connected mechanically and electrically to the p-type S/D regions 21Ba and 21Bb by way of the contact holes 65c and 65d, respectively.

Through the above-explained process steps, the pair of n- and p-channel TFTs having respectively the polysilicon islands 45A and 45B as their active layers (i.e., the pair of n- and p-channel polysilicon TFTs) is completed on the substrate 10. As a result, the semiconductor device 1b according to the third embodiment is obtained.

With the above-described method of fabricating the semiconductor device 1b according to the third embodiment, by conducting the series of operations of formation, exposure and development of the resist film for the mask 17A, impurity implantation to the a-Si film 14 and selective etching of the a-Si film 14 (FIGS. 4A to 4C) only once, the surface-etched n-type impurity-doped regions 19Aa" and 19Ab" and the surface-etched n-type impurity-doped regions 21Aa" and 21Ab' are obtained. Similarly, by conducting the series of operations of formation, exposure and development of the resist film for the mask 17B, and impurity implantation to the a-Si film 14 (FIGS. 4D to 4E) only once, the surface-non-etched p-type impurity-doped regions 21Ba' and 21Bb' are obtained.

Moreover, the a-Si film 14 is crystallized by irradiating the laser light B to the whole surface of the a-Si film 14 containing the n- and p-type impurity ions, thereby forming the polysilicon film 35b (FIG. 4F). Thus, simultaneously with the crystallization of the a-Si film 14, the n-type impurity ions (i.e., phosphorus ions) in the n-type impurity-doped regions 21Aa" and 21Ab" (which will be the S/D regions 21Aa and 21Ab later) and the p-type impurity ions (i.e., boron ions) in the p-type impurity-doped regions 21Ba' and 21Bb' (which will be the S/D regions 21Ba and 21Bb later) are activated.

Therefore, no additional process step is required for activating the said n- and p-type impurity ions. Accordingly, the total number of the required fabrication process steps for the semiconductor device 1b according to the third embodiment is decreased, and the fabrication cost thereof is lowered furthermore.

Furthermore, since the surfaces of the n-type impurity-doped regions 21Aa" and 21Ab" (which will be the S/D regions 21Aa and 21Ab later) are selectively etched away (FIG. 4C), removal of the unwanted heavy metal impurity that have been implanted into the a-Si film 14 along with the desired n-type impurity (i.e., phosphorus) is ensured. Therefore, fluctuation of initial characteristics of the n-channel TFT including the pair of n-type S/D regions 21Aa and 21Ab is improved and its reliability is raised as well, compared with the conventional method where the heavy-metal impurity is not removed. This means that the operation characteristic and reliability of the said TFT (and therefore, the device 1b) are improved.

Additionally, unlike the structure as disclosed in the above-described Publication No. 2003-332349 where the alignment marks are disposed only on the periphery of the substrate, the first alignment marks 19Aa and 19Ab are respectively formed near the n-type S/D region 21Aa and the p-type S/D region 21Bb in the polysilicon film 35b, and the second alignment marks 47a and 47b are respectively formed near the polysilicon islands 45A and 45B. Therefore, the first alignment marks 19Aa and 19Ab can be used for alignment of an upper pattern or patterns with respect to the S/D regions 21Aa, 21Ab, 21Ba, and 21Bb. The second alignment marks 47a and 47b can be used for alignment of an upper pattern or patterns with respect to the polysilicon islands 45A and 45B. Consequently, there is an additional advantage that higher alignment accuracy than ever is obtained for upper patterns for the n- and p-channel TFTs.

Fourth Embodiment

[Method of Fabricating Semiconductor Device]

Next, a method of fabricating a semiconductor device according to a fourth embodiment of the invention will be explained below with reference to FIGS. 5A to 5L.

The method of the fourth embodiment corresponds to the one obtained by adding process steps of implanting respectively n- and p-type impurities into the channel regions of the n- and p-channel TFTs for threshold adjustment to the method of the third embodiment. Therefore, the semiconductor device 1c fabricated by the method of the fourth embodiment corresponds to the one obtained by adding respectively the impurity-doped regions for threshold adjustment to the channel regions of the n- and p-channel TFTs in the semiconductor device 1b of the third embodiment.

First, the process steps of FIGS. 4A to 4E in the method of the third embodiment are carried out. Thus, as shown in FIG. 4E, a pair of n-type impurity-doped regions 19Aa" and 19Ab", a pair of n-type impurity-doped regions 21Aa" and 21Ab", and a pair of p-type impurity-doped regions 21Ba' and 21Bb' are formed in the a-Si film 14. The surfaces of the n-type impurity-doped regions 19Aa", 19Ab", 21Aa", and 21Ab" are etched away; however, the surfaces of the p-type impurity-doped regions 21Ba' and 21Bb' are not etched away. The etching depth of the a-Si film 14 in the etching process of FIG. 4C is set at 50 angstrom similar to the first embodiment. After the ion-implantation process of p-type dopant, the mask 17B is removed.

Next, as shown in FIG. 5A, a mask 26 with an opening 26a is formed on the a-Si film 14. The opening 26a is located at a position corresponding to a channel region 21Ac of an n-channel TFT. Thereafter, as shown in FIG. 5B, p-type impurity ions (e.g., boron ions) for controlling the threshold of the said n-channel TFT are selectively implanted into the a-Si film 14 using the mask 26. In this ion-implantation process, the dose is set at $1 \times 10^{12}$ cm$^{-2}$. Thus, the p-type impurity ions are selectively implanted into the a-Si film 14 by way of the opening 26a of the mask 26, resulting in a p-type impurity-doped region 14b1 in the a-Si film 14. After the completion of this ion-implantation process, the mask 26 is removed.

Figure 5D:
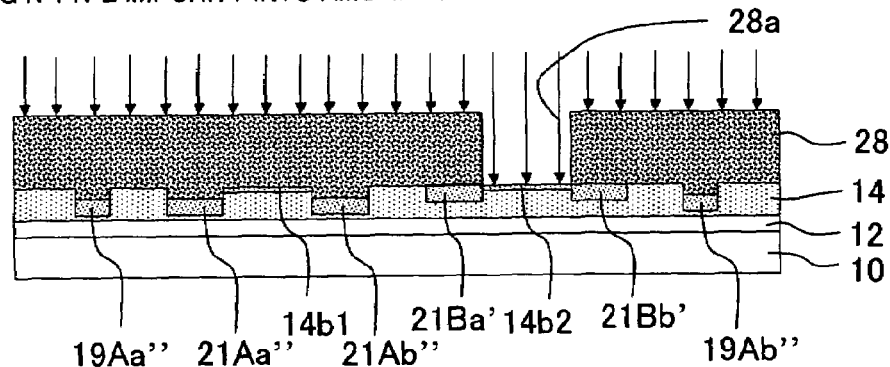

Next, as shown in FIG. 5C, a mask 28 with an opening 28a is formed on the a-Si film 14. The opening 28a is located at a position corresponding to a channel region 21Bc of a p-channel TFT. Thereafter, as shown in FIG. 5D, n-type impurity ions (e.g., phosphorus ions) for controlling the threshold of the said TFT are selectively implanted into the a-Si film 14 using the mask 28. In this ion-implantation process, the dose is set at $1 \times 10^{12}$ cm$^{-2}$. Thus, the n-type impurity ions are selectively implanted into the a-Si film 14 by way of the opening 28a of the mask 28, resulting in an n-type impurity-doped region 14b2 in the a-Si film 14. After the completion of this ion-implantation process, the mask 28 is removed.

Figure 5E:
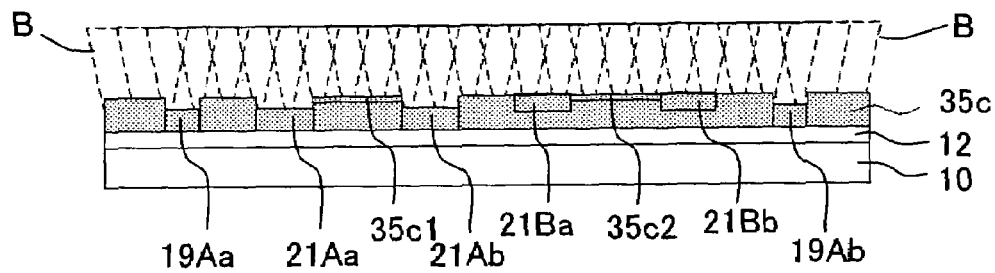

The subsequent process steps are the same as those of the method in the third embodiment. Specifically, as shown in FIG. 5E (FIG. 4F), excimer laser light B is irradiated to the whole surface of the a-Si film 14 by the ELA method to thereby crystallize the a-Si film 14, resulting in a polysilicon film 35c. At this time, the n-type doped impurity (i.e., phosphorus) in the n-type impurity-doped regions 21Aa", 21Ab", and 14b2 and the p-type doped impurity (i.e., boron) in the p-type impurity-doped regions 21Ba', 21Bb', and 14b1 are activated and therefore, any additional activation process for the said doped impurities is not required. Moreover, due to the crystallization of the a-Si film 14, the n-type impurity-doped regions 19Aa" and 19Ab" are respectively turned to the first alignment marks 19Aa and 19Ab. Similarly, the n-type impurity-doped regions 21Aa" and 21Ab" are respectively turned to the n-type S/D regions 21Aa and 21Ab of the n-channel TFT. The p-type impurity-doped region 14b1 is turned to the p-type impurity-doped region 35c1 of the n-channel TFT. The p-type impurity-doped regions 21Ba" and 21Bb" are respectively turned to the p-type S/D regions 21Ba and 21Bb of the p-channel TFT. The n-type impurity-doped region 14b2 is turned to the n-type impurity-doped region 35c2 of the p-channel TFT.

Figure 5F:
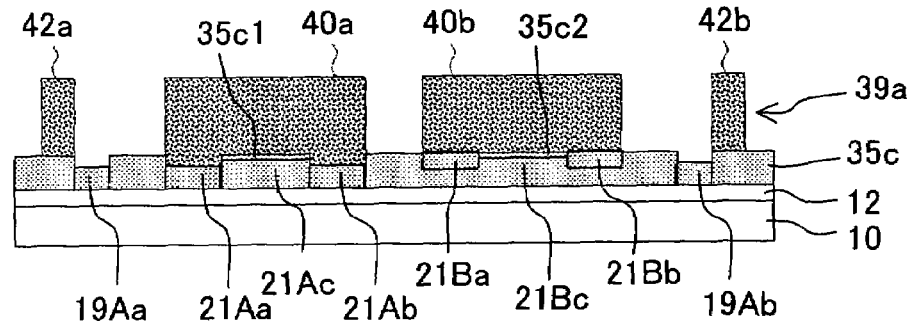

Next, as shown in FIG. 5F (FIG. 4G), a mask 39a is formed on the polysilicon film 35c. The mask 39a has a pattern comprising the part 40a for forming the polysilicon island 45A', the part 40b for forming the polysilicon island 45B', and the parts 42a and 42b for forming the second alignment marks 47a and 47b, the remainder of the mask 39a being removed. Alignment of the mask 39a is carried out using the previously formed first alignment marks 19Aa and 19Ab. Since the first alignment marks 19Aa and 19Ab are respectively disposed near the n-type S/D region 21Aa and the p-type S/D region 21Bb, alignment of the mask 39a can be conducted at the accuracy of ±0.1 μm or less.

Figure 5G:
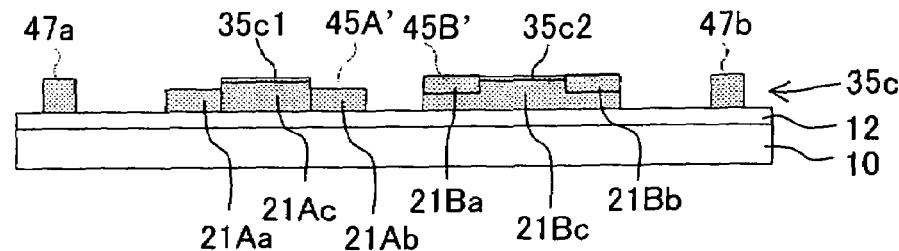

Next, as shown in FIG. 5G (FIG. 4H), the polysilicon film 35c is selectively etched using the mask 39a, thereby forming the island-shaped polysilicon film 35c, i.e., the polysilicon islands 45A' and 45B". At the same time, the pair of second alignment marks 47a and 47b are formed by the polysilicon film 35c near the islands 45A' and 45B', respectively. The island 45A' includes the pair of n-type S/D regions 21Aa and 21Ab, and the channel region 21Ac disposed between the S/D regions 21Aa and 21Ab. Similarly, the island 45B' includes the pair of p-type S/D regions 21Ba and 21Bb, and the channel region 21Bc disposed between the S/D regions 21Ba and 21Bb.

Figure 5H:
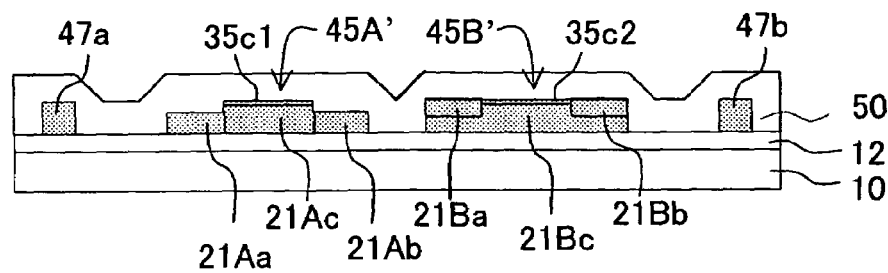

Next, as shown in FIG. 5H (FIG. 4I), a gate insulating film 50 is formed on the backing film 12 to cover the polysilicon islands 45A' and 45B' and the second alignment marks 47a and 47b. The gate insulating film 50 covers the whole surface of the substrate 10. The method of forming the film 50 may be the same as that of the third embodiment.

Figure 5I:
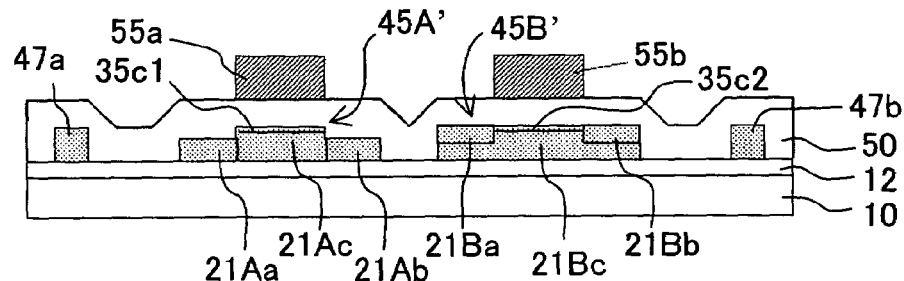

Next, as shown in FIG. 5I (FIG. 4J), gate electrodes/lines 55a and 55b are formed on the gate insulating film 50. The method of forming the gate electrodes/lines 55a and 55b may be the same as that of the third embodiment. Alignment in this process is conducted using the polysilicon islands 45A' and 45B' and the second alignment marks 47a and 47b.

Figure 5J:
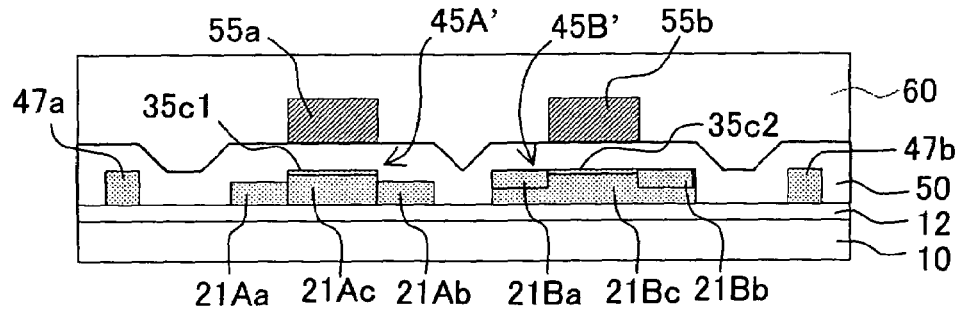

Next, as shown in FIG. 5J (FIG. 4K), an interlayer insulting film 60 is formed on the gate insulating film 50 to cover the gate electrodes/lines 55a and 55b. The film 60 covers the whole surface of the substrate 10. The method of forming the film 60 may be the same as that of the third embodiment. The surface of the film 60 is then planarized by a known method.

Figure 5K:
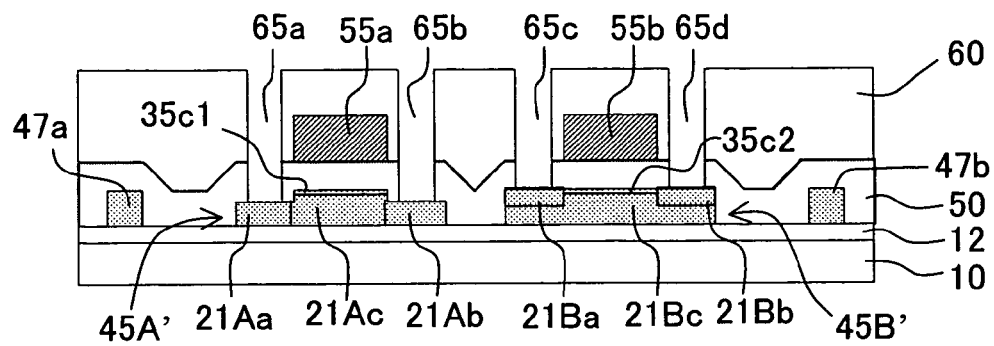

Next, as shown in FIG. 5K (FIG. 4L), a pair of contact holes 65a and 65b and a pair of contact holes 65c and 65d are formed to penetrate the interlayer insulting film 60 and the gate insulating film 50 by a known method. The holes 65a and 65b reach the n-type S/D regions 21Aa and 21Ab of the polysilicon island 45A', respectively. The holes 65c and 65d reach the p-type S/D regions 21Ba and 21Bb of the polysilicon island 45B', respectively.

Figure 5L:
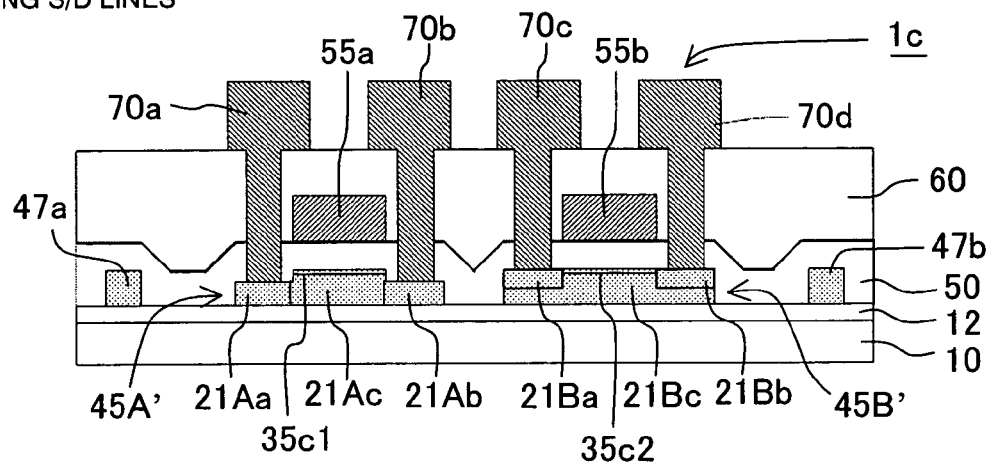

Next, as shown in FIG. 5L (FIG. 4M), a metal film is deposited on the interlayer insulating film 60 and patterned by a known method, thereby forming a pair of S/D lines 70a and 70b and a pair of S/D lines 70c and 70d on the film 60. The S/D lines 70a and 70b are connected mechanically and electrically to the n-type S/D regions 21Aa and 21Ab by way of the contact holes 65a and 65b, respectively. The S/D lines 70c and 70d are connected mechanically and electrically to the p-type S/D regions 21Ba and 21Bb by way of the contact holes 65c and 65d, respectively.

Through the above-explained process steps, the pair of n- and p-channel TFTs having the polysilicon film 35c as the active layer (i.e., the n- and p-channel polysilicon TFTs) is completed on the substrate 10. As a result, the semiconductor device 1c according to the fourth embodiment is obtained.

With the above-described semiconductor device 1c and the method of fabricating the device 1c according to the fourth embodiment, because of the same reason as that of the semiconductor device 1 and the method of fabricating the device 1 according to the first embodiment, the following advantages (a) to (d) are obtained.

(a) The total number of the required fabrication process steps for the semiconductor device 1c according to the fourth embodiment is decreased, and the fabrication cost thereof is lowered furthermore.

(b) The operation characteristic and reliability of the n-channel TFT (and therefore, the device 1c) are improved.

(c) Higher alignment accuracy than ever is obtained for upper patterns.

(d) The threshold of the n- and p-channel TFTs is well controllable or adjustable.

Fifth Embodiment

[Method of Fabricating Semiconductor Device]

Next, a method of fabricating a semiconductor device according to a fifth embodiment of the invention will be explained below with reference to FIGS. 6A to 6I.

The method of the fifth embodiment corresponds to the one obtained by adding a process step of implanting an impurity (n-type or p-type) into the channel regions of the n- and p-channel TFTs for threshold adjustment to the method of the third embodiment, which is the same as the method of the fourth embodiment. However, the method of the fifth embodiment is different from the method of the fourth embodiment in that the ion-implantation step of the impurity for threshold adjustment is conducted over the whole surface of the substrate 10 without using any mask.

First, the process steps of FIGS. 4A to 4E in the method of the third embodiment are carried out. Thus, as shown in FIG. 4E, a pair of n-type surface-etched impurity-doped regions 19Aa" and 19Ab", a pair of n-type surface-etched impurity-doped regions 21Aa" and 21Ab", and a pair of p-type surface-non-etched impurity-doped regions 21Ba' and 21Bb' are formed. The etching depth of the a-Si film 14 in the etching process of FIG. 4C is set at 50 angstrom similar to the first embodiment. After the ion-implantation process of the p-type impurity, the mask 17B is removed.

Figure 6A:
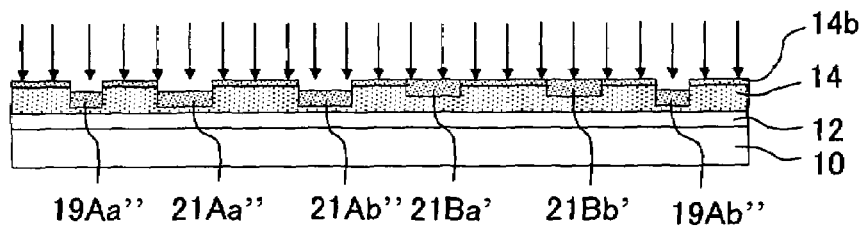
FIGS. 6A to 6I are partial cross-sectional views showing a method of fabricating a semiconductor device according to a fifth embodiment of the present invention, respectively.

Next, as shown in FIG. 6A, an n- or p-type impurity ions (e.g., boron ions) for controlling the threshold of the n- and p-channel TFTs is implanted into the whole surface of the a-Si film 14 without any mask. In this ion-implantation process, the dose is set at $1 \times 10^{12}$ cm$^{-2}$. Thus, the p-type impurity ions (i.e., boron ions) are implanted into not only the n-type impurity-doped regions 19Aa" 19Ab", 21Aa", and 21Ab' but also the p-type impurity-doped regions 21Ba' and 21Bb'. In the remaining surface of the film 14 other than the regions 19Aa", 19Ab", 21Aa", 21Ab", 21Ba', and 21Bb', p-type impurity-doped regions 14b are formed.

The concentration of the implanted impurity (i.e., boron) for threshold adjustment is lower than that of the impurity in the n-type impurity-doped regions 21Aa" and 21Ab" and that of the p-type impurity-doped regions 21Ba" and 21Bb" by one figure or digit or more. Therefore, the implanted impurity for threshold adjustment does not affect the operation of the n- and p-channel TFTs.

Figure 6B:
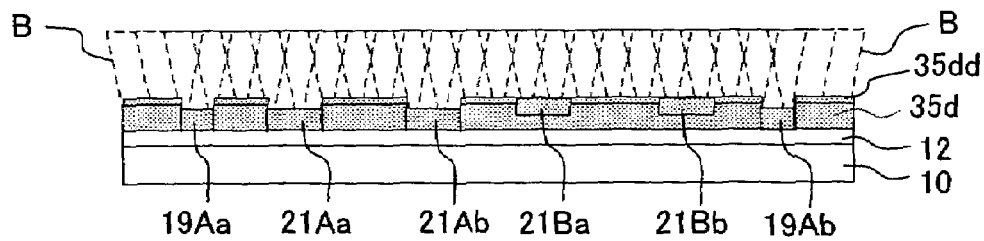

The subsequent process steps are the same as those of the method in the third embodiment. Specifically, as shown in FIG. 6B (FIG. 4F), excimer laser light B is irradiated to the whole surface of the a-Si film 14 by the ELA method to thereby crystallize the a-Si film 14, resulting in a polysilicon film 35d. At this time, the n-type doped impurity (i.e., phosphorus) and the p-type doped impurity (i.e., boron) existing in the n-type impurity-doped regions 21Aa" and 21Ab", and the p-type doped impurity (i.e., boron) existing in the p-type impurity-doped regions 21Ba', 21Bb', and 14b are activated and therefore, any additional activation process for the said doped impurities is not required. Moreover, due to the crystallization of the a-Si film 14, the n-type impurity-doped regions 19Aa" and 19Ab" are respectively turned to the first alignment marks 19Aa and 19Ab. Similarly, the n-type impurity-doped regions 21Aa" and 21Ab" are respectively turned to the n-type S/D regions 21Aa and 21Ab of the n-channel TFT. The p-type impurity-doped regions 21Ba' and 21Bb' are respectively turned to the p-type S/D regions 21Ba and 21Bb of the p-channel TFT. The p-type impurity-doped regions 14b are turned to the p-type impurity-doped regions 35dd.

Figure 6C:
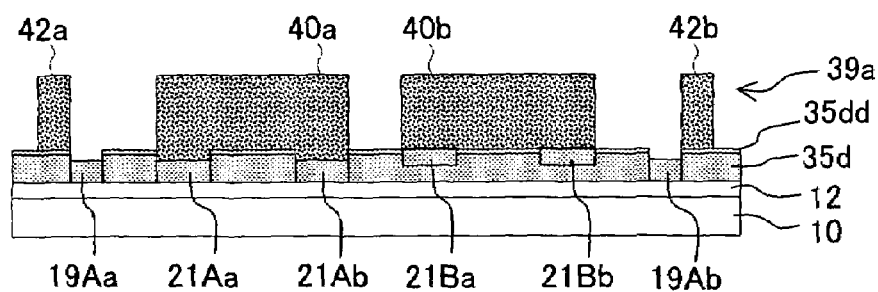

Next, as shown in FIG. 6C (FIG. 4G), a mask 39a is formed on the polysilicon film 35d. The mask 39a has a pattern comprising the part 40a for forming a polysilicon island 45A", the part 40b for forming a polysilicon island 45B", and the parts 42a and 42b for forming second alignment marks 47a and 47b, the remainder of the mask 39a being removed. Alignment of the mask 39a is carried out using the previously formed first alignment marks 19Aa and 19Ab. Since the first alignment marks 19Aa and 19Ab are respectively disposed near the n-type S/D region 21Aa and the p-type S/D region 21Bb, alignment of the mask 39a can be conducted at the accuracy of ±0.1 µm or less.

Figure 6D:
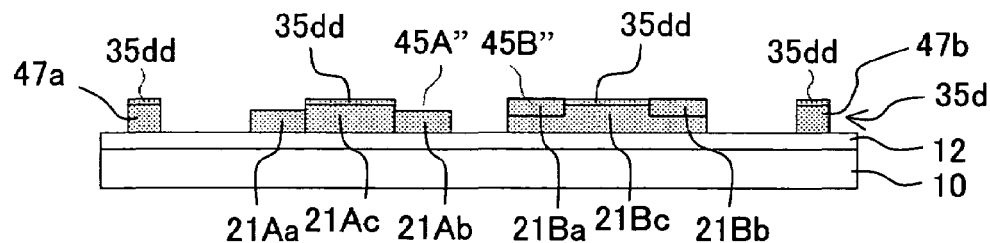

Next, as shown in FIG. 6D (FIG. 4H), the polysilicon film 35d is selectively etched using the mask 39a, thereby forming the island-shaped polysilicon film 35d, i.e., polysilicon islands 45A" and 45B". At the same time, the pair of second alignment marks 47a and 47b are formed by the polysilicon film 35d near the islands 45A" and 45B", respectively. The island 45A" includes the pair of n-type S/D regions 21Aa and 21Ab, and a channel region 21Ac disposed between the S/D regions 21Aa and 21Ab. Similarly, the island 45B" includes the pair of p-type S/D regions 21Ba and 21Bb, and a channel region 21Bc disposed between the S/D regions 21Ba and 21Bb.

Figure 6E:
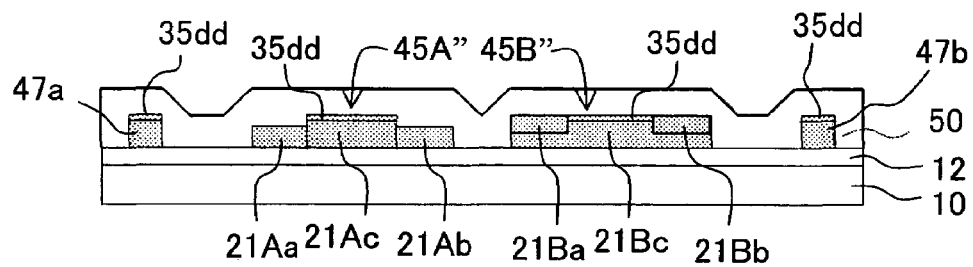

Next, as shown in FIG. 6E (FIG. 4I), a gate insulating film 50 is formed on the backing film 12 to cover the polysilicon islands 45A" and 45B" and the second alignment marks 47a and 47b. The gate insulating film 50 covers the whole surface of the substrate 10. The method of forming the film 50 may be the same as that of the third embodiment.

Figure 6F:
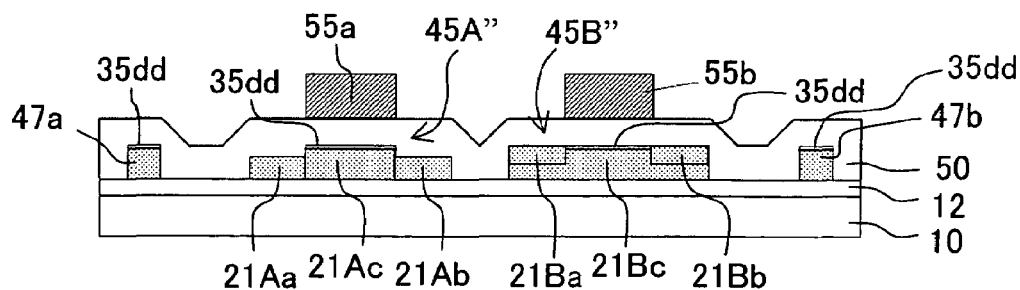

Next, as shown in FIG. 6F (FIG. 4J), gate electrodes/lines 55a and 55b are formed on the gate insulating film 50. The method of forming the gate electrodes/lines 55a and 55b may be the same as that of the third embodiment. Alignment in this process is conducted using the polysilicon islands 45A" and 45B" and the second alignment marks 47a and 47b.

Figure 6G:
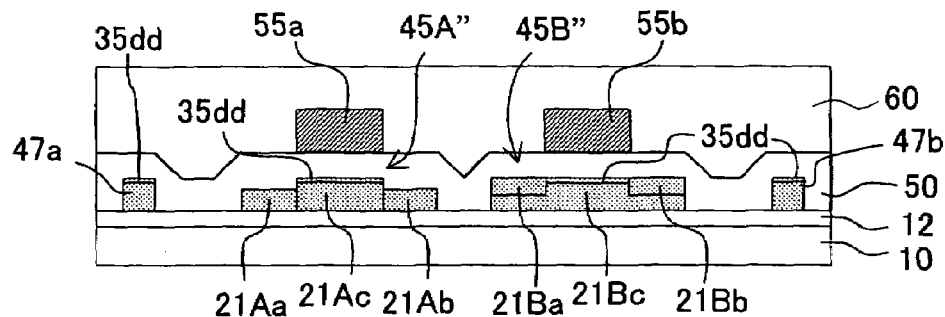

Next, as shown in FIG. 6G (FIG. 4K), an interlayer insulting film 60 is formed on the gate insulating film 50 to cover the gate electrodes/lines 55a and 55b. The film 60 covers the whole surface of the substrate 10. The method of forming the film 60 may be the same as that of the third embodiment. The surface of the film 60 is then planarized by a known method.

Figure 6H:
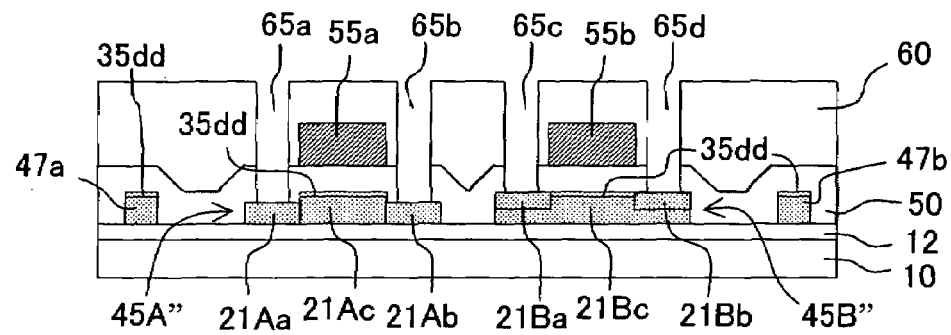

Next, as shown in FIG. 6H (FIG. 4L), a pair of contact holes 65a and 65b and a pair of contact holes 65c and 65d are formed to penetrate the interlayer insulting film 60 and the gate insulating film 50 by a known method. The holes 65a and 65b reach the n-type S/D regions 21Aa and 21Ab of the polysilicon island 45A', respectively. The holes 65c and 65d reach the p-type S/D regions 21Ba and 21Bb of the polysilicon island 45B", respectively.

Figure 6I:
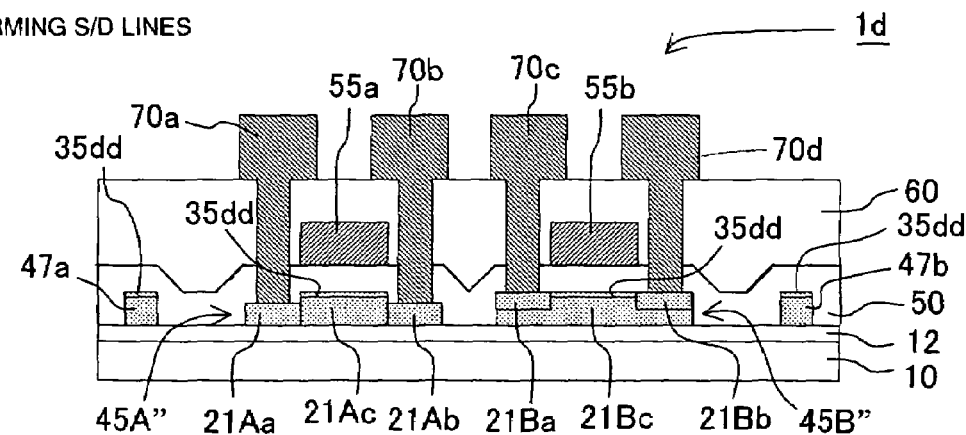

Next, as shown in FIG. 6I (FIG. 4M), a metal film is deposited on the interlayer insulating film 60 and patterned by a known method, thereby forming a pair of S/D lines 70a and 70b and a pair of S/D lines 70c and 70d on the film 60. The S/D lines 70a and 70b are connected mechanically and electrically to the n-type S/D regions 21Aa and 21Ab by way of the contact holes 65a and 65b, respectively. The S/D lines 70c and 70d are connected mechanically and electrically to the p-type S/D regions 21Ba and 21Bb by way of the contact holes 65c and 65d, respectively.

Through the above-explained process steps, the pair of n- and p-channel TFTs having the polysilicon film 35d as the active layer (i.e., the n- and p-channel polysilicon TFTs) is completed on the substrate 10. As a result, the semiconductor device 1d according to the fifth embodiment is obtained.

The method of fabricating the semiconductor device 1d according to the fifth embodiment corresponds to the one obtained by adding a process step of implanting an impurity for threshold adjustment into the channel regions of the n- and p-channel TFTs to the method of the third embodiment. Therefore, the semiconductor device 1d fabricated by this method corresponds to the one obtained by adding the p-type impurity-doped regions 35dd to the respective channel regions 21Ac and 21Bc of the n- and p-channel TFTs.

With the above-described semiconductor device 1d and the method of fabricating the device 1d according to the fifth embodiment, because of the same reason as that of the semiconductor device 1 and the method of fabricating the device 1 according to the first embodiment, the following advantages (a) to (d) are obtained.

(a) The total number of the required fabrication process steps for the semiconductor device 1d according to the fifth embodiment is decreased, and the fabrication cost thereof is lowered furthermore.

(b) The operation characteristic and reliability of the n-channel TFT (and therefore, the device 1d) are improved.

(c) Higher alignment accuracy than ever is obtained for upper patterns.

(d) The threshold of the n- and p-channel TFTs is well controllable or adjustable.

Sixth Embodiment

[Method of Fabricating Semiconductor Device]

Next, a method of fabricating a semiconductor device according to a sixth embodiment of the invention will be explained below with reference to FIGS. 7A to 7J.

The method of the sixth embodiment corresponds to the one obtained by adding process steps of forming Lightly-Doped Drain (LDD) regions for the TFT in the method of the first embodiment. Therefore, the semiconductor device 1e according to the sixth embodiment corresponds to the one obtained by adding the LDD structure to the semiconductor device 1 according to the first embodiment.

First, the process steps of FIGS. 2A to 2E in the method of the first embodiment are carried out. Thus, as shown in FIG. 2E, a pair of surface-etched p-type impurity-doped regions 18a" and 18b" and a pair of surface-etched p-type impurity-doped regions 20a" and 20b" are formed in the a-Si film 14. The etching depth of the a-Si film 14 is set at 50 angstrom similar to the first embodiment.

Figure 7A:
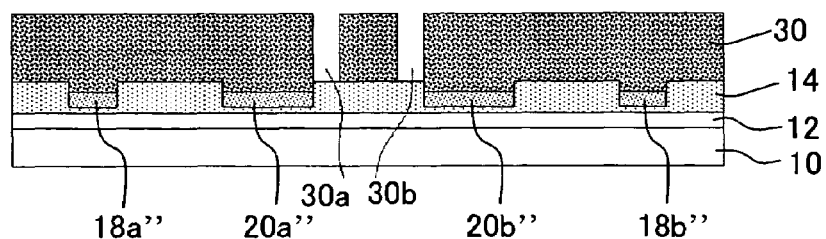
FIGS. 7A to 7J are partial cross-sectional views showing a method of fabricating a semiconductor device according to a sixth embodiment of the present invention, respectively.

After removing the mask 16, as shown in FIG. 7A, a mask 30 for forming the LDD regions is formed on the a-Si film 14. This mask 30 is obtained by forming a photosensitive resist film by coating and then, exposing and the developing the said resist film. Thereafter, a proper impurity (here, boron) for forming the LDD regions is selectively implanted into the a-Si film 14 using the mask 30. In this ion-implantation process, the dose is set at $1 \times 10^{13}$ cm$^{-2}$.

Figure 7B:
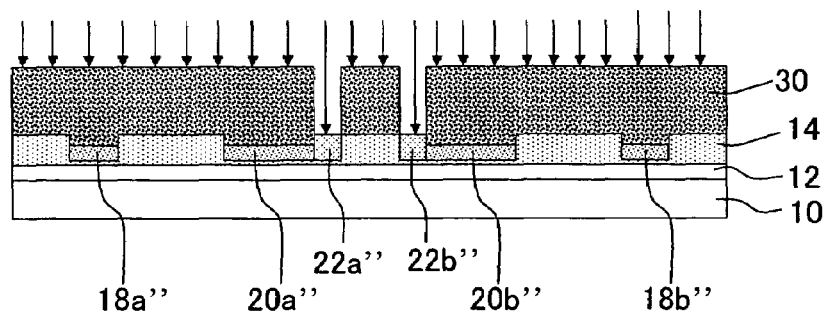

Thus, the p-type impurity ions (i.e., boron ions) are selectively implanted into the a-Si film 14 by way of the openings 30a and 30b of the mask 30, thereby forming a pair of p-type impurity-doped regions 22a" and 22b" between the pair of p-type impurity-doped regions 20a" and 20b", as shown in FIG. 7B. The p-type impurity-doped regions 22a" and 22b", which are apart from each other, are contacted with the p-type impurity-doped regions 20a" and 20b", respectively. After the ion implantation is completed, the mask 30 is removed.

Figure 7C:
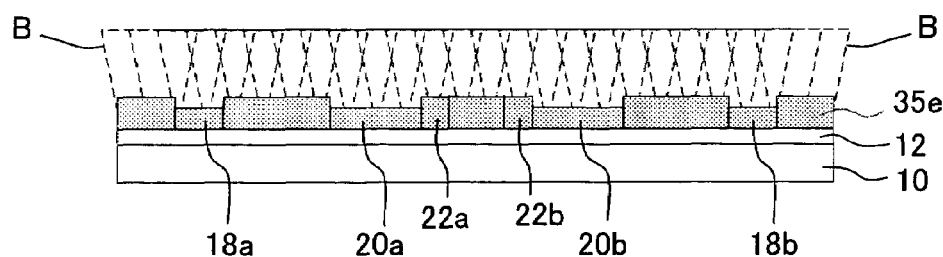

The subsequent process steps are the same as those of the method of the first embodiment. Specifically, as shown in FIG. 7C (FIG. 2F), excimer laser light B is irradiated to the whole surface of the a-Si film 14 by the ELA method to crystallize the a-Si film 14, thereby forming a polysilicon film 35e. At this time, the doped impurity (i.e., boron) in the impurity-doped regions 20a", 20b", 22a", and 22b" is activated and therefore, any additional activation process for the said doped impurity is not required. Moreover, due to the crystallization of the a-Si film 14, the p-type impurity-doped regions 18a" and 18b" are respectively turned to the first alignment marks 18a and 18b, and the p-type impurity-doped regions 20a" and 20b" are respectively turned to the p-type S/D regions 20a and 20b. The p-type impurity-doped regions 22a" and 22b" are respectively turned to the p-type LDD regions 22a and 22b.

Figure 7D:
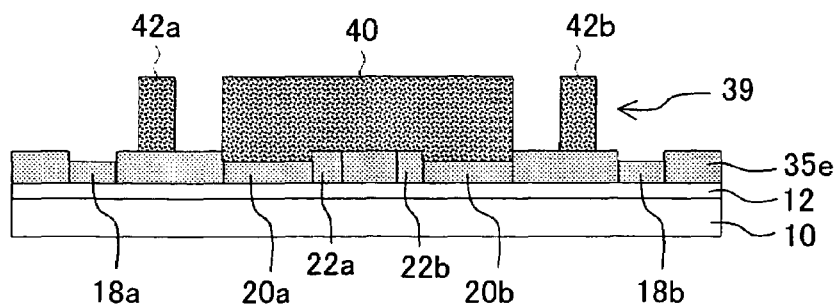

Next, as shown in FIG. 7D (FIG. 2G), a photosensitive resist film is formed on the polysilicon film 35e by coating and then, the said resist film is exposed and developed, thereby forming a mask 39 for forming a polysilicon island 45b and second alignment marks 47a and 47b. The mask 39 has a pattern comprising the part 40 for forming the polysilicon island 45b and the parts 42a and 42b for forming the second alignment marks 47a and 47b, the remainder of the mask 39 being removed. Alignment of the mask 39 is carried out using the previously formed first alignment marks 18a and 18b. Since the first alignment marks 18a and 18b are respectively disposed near the S/D regions 20a and 20b, alignment of the mask 39 can be conducted at the accuracy of ±0.1 µm or less.

Figure 7E:
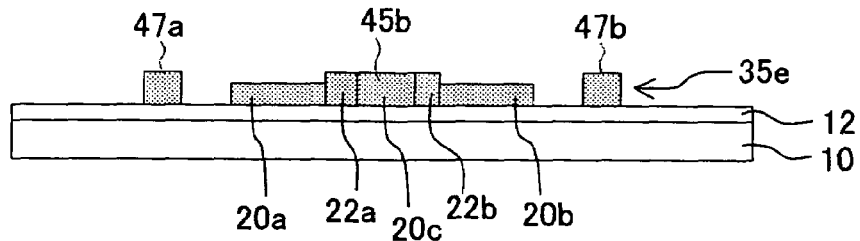

Next, as shown in FIG. 7E (FIG. 2H), the polysilicon film 35e is selectively etched using the mask 39, thereby forming the island-shaped polysilicon film 35e, i.e., the polysilicon island 45b. At the same time, the pair of second alignment marks 47a and 47b are formed at each side of the island 45b near the island 45b. The island 45b includes the pair of p-type S/D regions 20a and 20b, the pair of p-type LDD regions 22a and 22b, and a channel region 20c disposed between the LDD regions 22a and 22b.

Figure 7F:
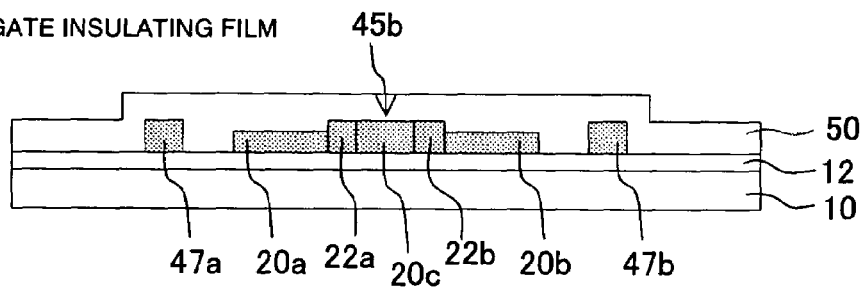

Next, as shown in FIG. 7F (FIG. 2I), a gate insulating film 50 is formed on the backing film 12 to cover the polysilicon island 45b and the second alignment marks 47a and 47b. The gate insulating film 50 covers the whole surface of the substrate 10. The film 50 may be formed by the same processes as used in the first embodiment.

Figure 7G:
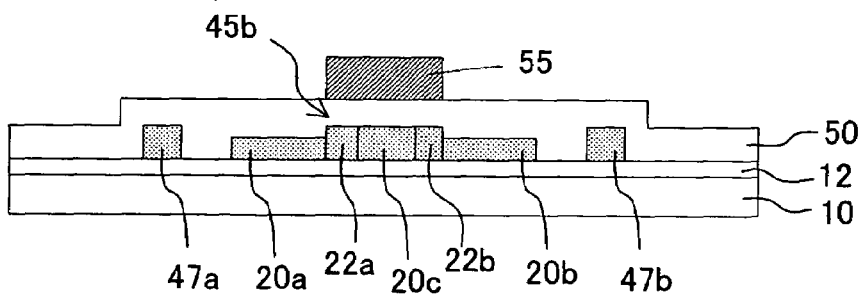

Next, as shown in FIG. 7G (FIG. 2J), a gate electrode/line 55 is formed on the gate insulating film 50 to be superposed on the channel region 20c and the LDD regions 22a and 22b.

The gate electrode/line 55 may be formed by the same processes as used in the first embodiment. Alignment in this process is conducted using the polysilicon island 45b and the second alignment marks 47a and 47b.

Figure 7H:
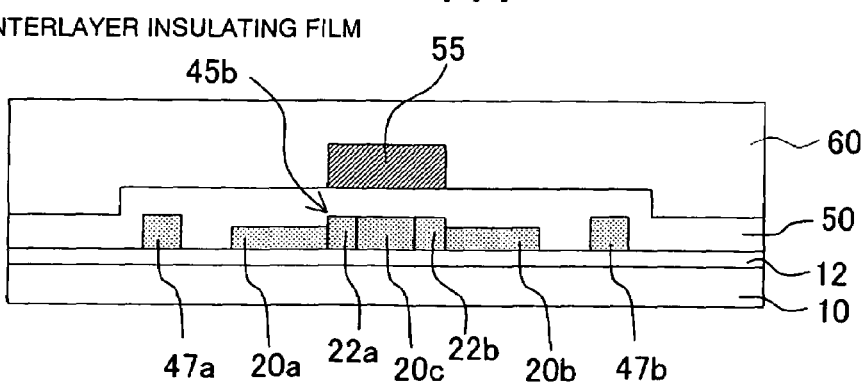

Next, as shown in FIG. 7H (FIG. 2K), an interlayer insulting film 60 is formed on the gate insulating film 50 to cover the gate electrode/line 55. The film 60 covers the whole surface of the substrate 10. The film 60 may be formed by the same processes as used in the first embodiment. The surface of the film 60 is then planarized by a known method.

Figure 7I:
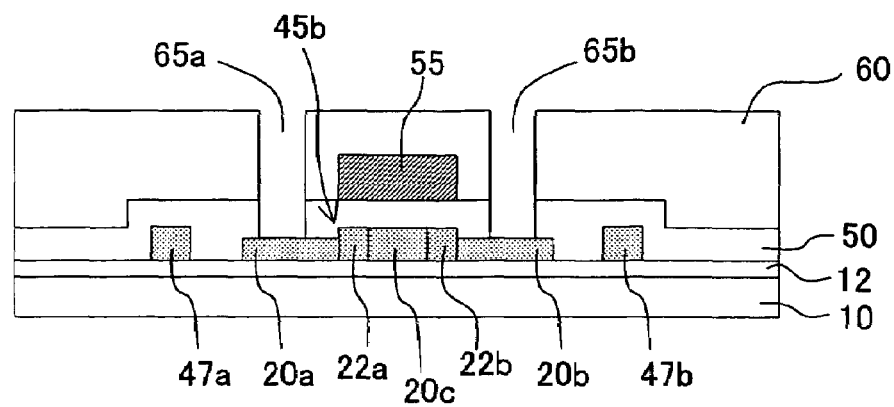

Next, as shown in FIG. 7I (FIG. 2L), a pair of contact holes 65a and 65b are formed to penetrate the interlayer insulting film 60 and the gate insulating film 50 by a known method. The holes 65a and 65b reach the S/D regions 20a and 20b of the polysilicon island 45b, respectively.

Figure 7J:
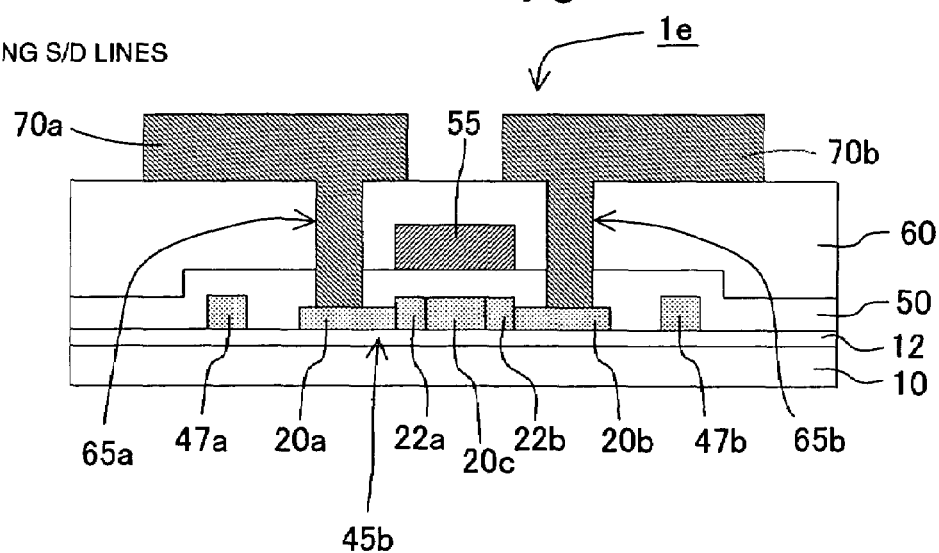

Next, as shown in FIG. 7J (FIG. 2M), a metal film is deposited on the interlayer insulating film 60 and patterned by a known method, thereby forming a pair of S/D lines 70a and 70b on the film 60. The S/D lines 70a and 70b are connected mechanically and electrically to the S/D regions 20a and 20b by way of the contact holes 65a and 65b, respectively.

Through the above-explained process steps, the TFT having the polysilicon film 35e as the active layer (i.e., the polysilicon TFT) is completed on the substrate 10. As a result, the semiconductor device 1e according to the sixth embodiment is fabricated.

With the above-described semiconductor device 1e and the method of fabricating the device 1e according to the sixth embodiment, because of the same reason as that of the semiconductor device 1 and the method of fabricating the device 1 according to the first embodiment, the following advantages (a) to (d) are obtained.

(a) The total number of the required fabrication process steps for the semiconductor device 1e according to the sixth embodiment is decreased, and the fabrication cost thereof is lowered furthermore.

(b) The operation characteristic and reliability of the TFT (and therefore, the device 1e) are improved.

(c) Higher alignment accuracy than ever is obtained for upper patterns.

(d) The drain withstand voltage of the TFT is improved due to the LDD structure.

Other Embodiments

Since the above-described first to sixth embodiments are embodied examples of the present invention, it is needless to say that the present invention is not limited to these embodiments and their variations. Any other modification is applicable to these embodiments and variations.

For example, in the above-described third embodiment of the invention, the impurity implantation process for the S/D formation regions of the n-channel TFT is conducted and thereafter, the impurity implantation process for the S/D formation regions of the p-channel TFT is conducted. However, the order of these two processes may be opposite; in other words, the impurity implantation process for the S/D formation regions of the p-channel TFT may be conducted and thereafter, the impurity implantation process for the S/D formation regions of the n-channel TFT may be conducted.

In the above-described fourth embodiment of the invention, the impurity implantation process for threshold adjustment of the n-channel TFT is conducted and thereafter, the impurity implantation process for threshold adjustment of the p-channel TFT is conducted. However, the order of these two processes may be opposite; in other words, the impurity implantation process for threshold adjustment of the p-channel TFT may be conducted and thereafter, the impurity implantation process for threshold adjustment of the n-channel TFT may be conducted.

In the above-described sixth embodiment of the invention, the impurity implantation process for forming the S/D formation regions of the TFT is conducted and thereafter, the impurity implantation process for forming the LDD regions is conducted. However, the order of these processes may be opposite; in other words, the impurity implantation process for forming the LDD regions of the TFT may be conducted and thereafter, the impurity implantation process for forming the S/D formation regions may be conducted.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor device with a thin-film transistor (TFT), comprising:
    a substrate;
    an island-shaped semiconductor film formed directly on the substrate or over the substrate with an intervening backing film, the semiconductor film serving as an active layer of a first TFT;
    a pair of source/drain regions of the first TFT, formed in the semiconductor film;
    a channel region of the first TFT, formed between the pair of sourer/drain regions in the semiconductor film; and
    alignment marks provided substantially proximate but separate from the first TFT, wherein the alignment marks are provided on both sides of the source/drain regions,
    wherein the pair of source/drain regions are smaller in thickness than a remainder of the semiconductor film,
    wherein the alignment marks are equal in thickness to the remainder of the semiconductor film,
    and wherein a thickness difference between the pair of source/drain regions and the remainder of the semiconductor film is set in a range from at least ten angstroms ($10^{-9}$ m) to one hundred angstroms ($10^{-8}$ m).

2. The device according to claim 1, wherein the alignment marks are made of the same material as the semiconductor film.

3. The device according to claim 2, wherein pairs of said alignment marks are provided for two or more TFTs formed on the substrate.

4. The device according to claim 2, wherein said alignment marks provide an alignment of the TFTs at an accuracy of within ±0.1 μm or closer.

5. The device according to claim 1, further comprising an additional island-shaped semiconductor film formed directly on the substrate or over the substrate with an intervening backing film and in between the first TFT and one of the alignment marks, the additional semiconductor film serving as an active layer of an additional TFT,
    wherein an additional pair of source/drain regions of the additional TFT is formed in the additional semiconductor film,
    an additional channel region of the additional TFT is formed between the additional pair of source/drain regions in the additional semiconductor film, and
    the additional pair of source/drain regions are equal in thickness to a remainder of the additional semiconductor film.

6. The device according to claim 5, wherein said first TFT comprises an N-channel TFT, and said additional TFT comprises a P-channel TFT.

7. The device according to claim 1, wherein said thickness difference between the pair of source/drain regions and the remainder of the semiconductor film ensures a readability with an exposure apparatus of alignment marks.

8. A method of fabricating a semiconductor device with a TFT, comprising the steps of:
   forming an amorphous semiconductor film directly on a substrate or over a substrate with an intervening backing film;
   forming a first mask on the amorphous semiconductor film, the first mask having a first pattern for source/drain regions and a second pattern for first alignment marks;
   selectively implanting an impurity into the amorphous semiconductor him using the first mask, thereby forming first impurity-doped regions by the first pattern and second impurity-doped regions by the second pattern;
   selectively etching surfaces of the first impurity-doped regions and surfaces of the second impurity-doped regions using the first mask;
   irradiating laser light to the amorphous semiconductor film including the surface-etched first impurity-doped regions and the surface-etched second impurity-doped regions, thereby crystallizing the amorphous semiconductor film to form a polycrystalline semiconductor film and activating the impurity implanted into the first impurity-doped regions and the second impurity-doped regions;
   forming a second mask on the polycrystalline semiconductor film, the second mask having a third pattern for a semiconductor island; and
   selectively etching the polycrystalline semiconductor film using the second mask, thereby forming a semiconductor island by the third pattern,
   wherein in the step of irradiating laser light to the amorphous semiconductor film, a pair of source/drain regions are formed by the first impurity-doped regions and the first alignment marks are formed by the second impurity-doped regions in the polycrystalline semiconductor film,
   wherein in the step of selectively etching the polycrystalline semiconductor film, the pair of source/drain regions are included in the semiconductor island and the first alignment marks are excluded from the semiconductor island,
   wherein the second mask has a fourth pattern for second alignment marks in addition to the third pattern for the semiconductor island,
   wherein in the step of selectively etching the polycrystalline semiconductor film using the second mask to form the semiconductor island, second alignment marks are formed near the semiconductor island by the fourth pattern,
   wherein the second alignment marks are provided substantially proximate but separate from the TFT, wherein the second alignment marks are provided on both sides of the source/drain regions,
   wherein the pair of source/drain regions are smaller in thickness than a remainder of the semiconductor film,
   wherein the second alignment marks are equal in thickness to the remainder of the semiconductor film,
   and wherein a thickness difference between the pair of source/drain regions and the remainder of the semiconductor film is set in a range from at least ten angstroms ($10^{-9}$ m) to one hundred angstroms ($10^{-8}$ m).

9. The method according to claim 8, wherein in the step of selectively etching the polycrystalline semiconductor film using the second mask, alignment is conducted using the first alignment marks.

10. The method according to claim 8, further comprising a step of implanting an impurity for threshold adjustment into the surface of the amorphous semiconductor film,
   wherein the additional step is carried out before the step of irradiating laser light to the amorphous semiconductor film.

11. The method according to claim 8, further comprising a step of implanting an impurity for LDD structure formation into the surface of the amorphous semiconductor film,
   wherein the additional step is carried out before the step of irradiating laser light to the amorphous semiconductor film.

12. A method of fabricating a semiconductor device with a TFT of a first conductivity type and a TFT of a second conductivity type, comprising the steps of:
   forming an amorphous semiconductor film directly on a substrate or over a substrate with an intervening backing film;
   forming a first mask on the amorphous semiconductor film, the first mask having a first pattern for source/drain regions of a first TFT of a first conductivity type and a second pattern for first alignment marks;
   selectively implanting an impurity of the first conductivity type into the amorphous semiconductor film using the first-mask, thereby forming first impurity-doped regions by the first pattern and second impurity-doped regions by the second pattern;
   selectively etching surfaces of the first impurity-doped regions and surfaces of the second impurity-doped regions using the first mask;
   forming a second mask on the amorphous semiconductor film, the second mask having a third pattern for source/drain regions of a TFT of a second conductivity type;
   selectively implanting an impurity of the second conductivity type into the amorphous semiconductor film using the second mask, thereby forming third impurity-doped regions by the third pattern;
   irradiating laser light to the amorphous semiconductor film including the surface-etched first impurity-doped regions, the surface-etched second impurity-doped regions, and the third impurity-doped regions, thereby crystallizing the amorphous semiconductor film to form a polycrystalline semiconductor film and activating the impurities implanted into the first impurity-doped regions, the second impurity-doped regions, and the third impurity-doped regions;
   forming a third mask on the polycrystalline semiconductor film, the third mask having a fourth pattern for semiconductor islands; and
   selectively etching the polycrystalline semiconductor film using the third mask, thereby forming a first semiconductor island for the first TFT and a second semiconductor island for the second TFT by the fourth pattern,
   wherein in the step of irradiating laser light to the amorphous semiconductor film, a pair of source/drain regions of the first TFT is formed by the first impurity-doped regions, first alignment marks are formed by the second impurity-doped regions, and a pair of source/drain regions of the second TFT are formed by the third impurity-doped regions in the polycrystalline semiconductor film,
   wherein in the step of selectively etching the polycrystalline semiconductor film, the pair of source/drain regions of the first TFT are included in the first semiconductor island, the pair of source/drain regions of the second TFT are included in the second semiconductor island, and the first alignment marks are excluded from the first and second semiconductor islands, wherein the third mask has a fifth pattern for second alignment marks in addition to the fourth pattern for the semiconductor islands, wherein in the step of selectively etching the polycrystalline semiconductor film using the third mask to form the first and second semiconductor islands, second alignment marks are formed near the semiconductor islands by the fifth pattern, wherein the second alignment marks provided substantially proximate but separate from the first TFT, wherein the second alignment marks are provided on both sides of the source/drain regions of the first TFT, wherein the second semiconductor island is provided between the first TFT and one of the second alignment marks, wherein the pair of source/drain regions of the first TFT are smaller in thickness than a remainder of the semiconductor film, wherein the second alignment marks are equal in thickness to the remainder of the semiconductor film, and wherein a thickness difference between the pair of source/drain regions of the first TFT and the remainder of the semiconductor film is set in a range from at least ten angstroms ($10^{-9}$ m) to one hundred angstroms ($10^{-8}$ m).

13. The method according to claim 12, wherein in the step of selectively etching the polycrystalline semiconductor film using the third mask, alignment is conducted using the first alignment marks.

14. The method according to claim 12, further comprising a step of implanting an impurity for threshold adjustment into the surface of the amorphous semiconductor film, wherein the additional step is carried out before the step of irradiating laser light to the amorphous semiconductor film.

* * * * *